United States Patent [19]

Katsui et al.

[11] Patent Number: 5,650,912

[45] Date of Patent: Jul. 22, 1997

[54] HEAT SINK FOR COOLING A HEAT PRODUCING ELEMENT AND APPLICATION

[75] Inventors: Tadashi Katsui; Katsuhiko Nakata; Takeshi Koga; Tadanobu Matsumura; Yoshimi Tanaka; Yasuaki Sugimoto, all of Kawasaki; Takashi Kitahara, Matsudamachi; Takayuki Horinishi, Kawasaki, all of Japan

[73] Assignees: Fujitu Limited, Kawasaki; PFU Limited, Kahoku-gun, both of Japan

[21] Appl. No.: 478,667

[22] Filed: Jun. 7, 1995

Related U.S. Application Data

[62] Division of Ser. No. 433,131, May 3, 1995, Pat. No. 5,504,650, which is a continuation of Ser. No. 67,084, May 26, 1993, abandoned.

[30] Foreign Application Priority Data

| May 28, 1992 | [JP] | Japan | 4-137254 |
| Aug. 28, 1992 | [JP] | Japan | 4-230233 |
| Jan. 14, 1993 | [JP] | Japan | 5-005256 |
| Feb. 26, 1993 | [JP] | Japan | 5-038934 |

[51] Int. Cl.⁶ ................................. H05K 7/20
[52] U.S. Cl. ................. 361/697; 165/122; 361/687; 415/178; 415/213.1
[58] Field of Search .......................... 415/115, 177, 415/178, 208.3, 213.1, 214.1; 416/223 R; 312/236; 310/68 C, 68 D; 454/184; 257/722; 165/80.3, 121, 122, 125, 126, 185; 174/16.1, 16.3; 361/690, 694, 695–697, 687, 703, 717–719

[56] References Cited

U.S. PATENT DOCUMENTS

| 4,745,456 | 5/1988 | Clemens | 357/79 |
| 5,099,550 | 3/1992 | Beane et al. | 24/555 |
| 5,132,780 | 7/1992 | Higgins, III | 357/81 |
| 5,229,914 | 7/1993 | Bailey | 361/383 |
| 5,288,203 | 2/1994 | Thomas | 415/178 |
| 5,299,632 | 4/1994 | Lee | 165/80.3 |
| 5,309,983 | 5/1994 | Bailey | 165/80.3 |
| 5,409,352 | 4/1995 | Lin | 361/697 |
| 5,421,402 | 6/1995 | Lin | 361/697 |
| 5,437,327 | 8/1995 | Chiou | 165/122 |
| 5,475,564 | 12/1995 | Chiou | 361/704 |
| 5,504,650 | 4/1996 | Katsui | 361/697 |

FOREIGN PATENT DOCUMENTS

| 0 031 419 | 7/1981 | European Pat. Off. |
| 2 618 886 | 2/1989 | France . |
| 93 02 754.0 | 5/1993 | Germany . |

OTHER PUBLICATIONS

IBM Technical Disclosure Bulletin; vol. 30, No. 8; Dated Jan. 1988.

IBM Technical Disclosure Bulletin; vol. 34, No. 11; Dated Apr. 1992.

*Primary Examiner*—Gerald P. Tolin
*Attorney, Agent, or Firm*—Armstrong, Westerman, Hattori, Mcleland & Naughton

[57] ABSTRACT

A heat sink mounted on a heat producing element for cooling the heat producing element attached on the printed board of the electronic apparatus, having a heat sink body made of a good heat conductive material and a fan assembly installed inside the heat sink body. The heat sink body is efficiently air-cooled by a cooling air generated by the rotation of the fan assembly. The cooling air forcibly cools a base and a fixing wall of the base adjacent to the heat producing element and plate-like radiating fins or a pin-like radiating fins are protruded on the heat sink body to radiate the heat effectively. The position of the fan assembly is at the center of the heat sink body or is at the offset position from the center of the heat sink body. The heat sink of the present invention can be installed in a portable electronic apparatus such as a portable computer.

5 Claims, 43 Drawing Sheets

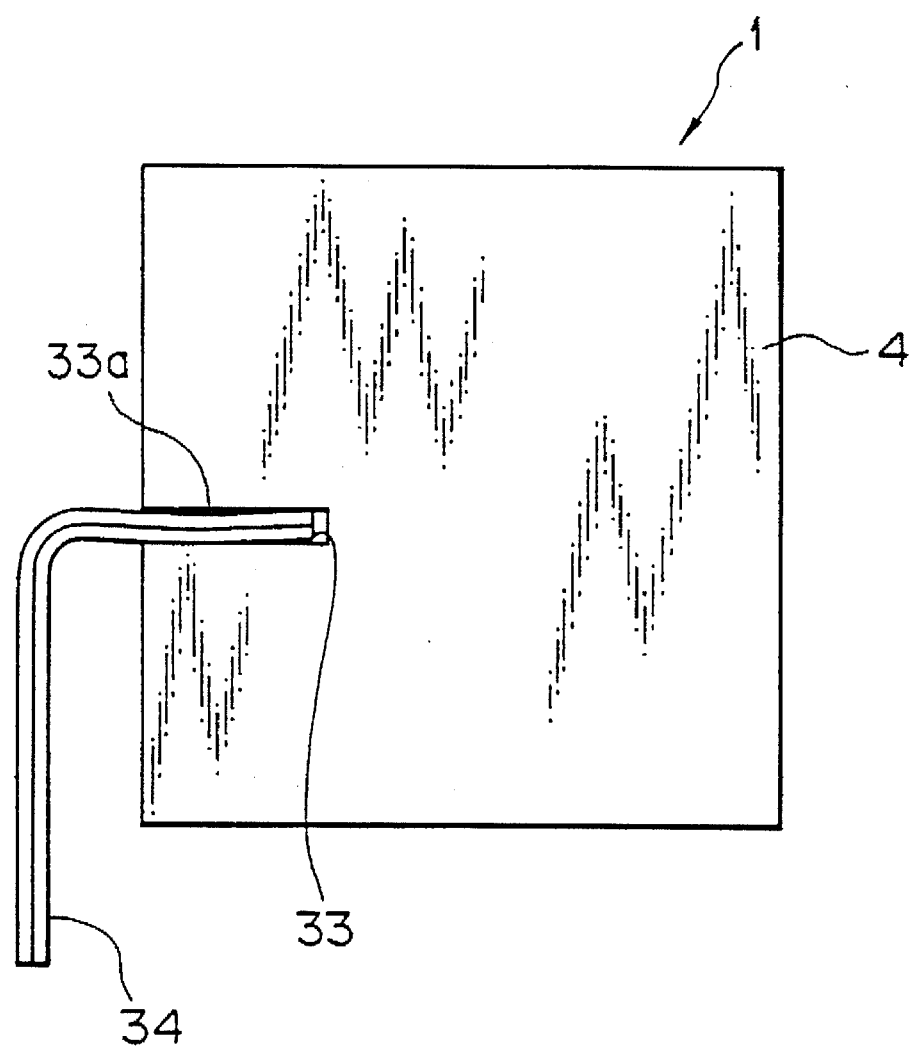

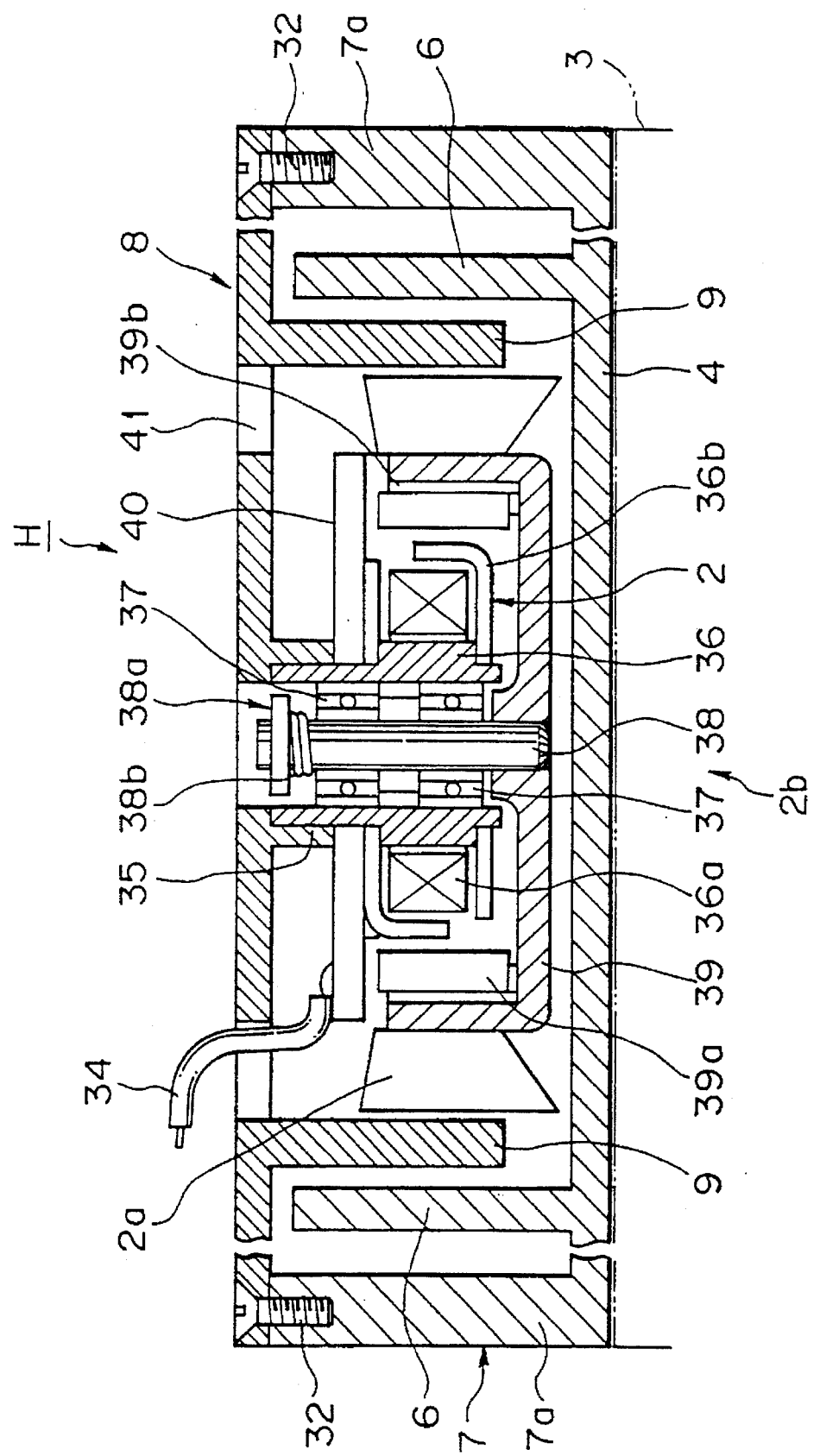

HEAT SINK FOR COOLING A HEAT PRODUCING ELEMENT AND APPLICATION

This is a divisional of application Ser. No. 08/433,131 filed May 3, 1995, now U.S. Pat. No. 5,504,650 which is a continuation of application Ser. No. 08/067,084 filed May 26, 1993, now abandoned.

BACKGROUND OF THE INVENTION

1. Field of the invention

The present invention relates to a heat sink for cooling a heat producing element by being mounted on the top face thereof, especially, the present invention relates to the heat sink having a fan assembly attached inside of its body and forcibly cooling a heat producing element with a cooling air generated by the rotation of the fan assembly.

2. Description of the Related Art

Among electronic devices, such as transistors and integrated circuits, it is not necessary for a device consuming a small quantity of current to radiate of heat produced therein, since the amount of heat produced therefrom is small. On the contrary, devices handling a large quantity of current, such as power transistors and integrated circuits for power amplifiers in audio equipment or a current booster in a constant voltage circuit, a large amount of power turns to heat in accordance with the operating state thereof and the device may break down when the temperature of the device increases above the operating temperature.

As a countermeasure to this, a heat sink for cooling the element is mounted on the device producing a large quantity of heat. The heat sink is usually made of a material having a good heat conductivity such as aluminum, and a set of radiating fins are disposed on the upper face of the heat sink. The heat sink is used in circumstances where cooling air is forcibly flowing and is adhered or mounted with pressure on the heat producing element, and the heat produced at the element is transferred to the heat sink and absorbed by its body or dissipated by the flowing air.

However, when the amount of heat produced by the element increases, it is necessary to increase the flowing speed of the cooling air around the element for increasing a cooling efficient, thereby it is required to use a powerful fan. The powerful fan generally requires an increase in the size of the fan or an increase in the rotational speed of the fan, thereby causing an increase in the space for the powerful fan or an increase in the noise generated by the powerful fan, as a result.

SUMMARY OF THE INVENTION

The object of the present invention is to provide a heat sink that can realize an efficiently cooling of a heat producing element without increasing the packaging space thereof.

According to one aspect of the present invention, a fan assembly is disposed inside a heat sink body made of material having a good heat conductivity, so that a fixing wall of the heat sink body positioned next to the heat producing element is forcibly cooled by the cooling air generated by the rotation of the fan assembly during the operation of the heat producing element.

According to another aspect of the present invention, a flowing route of the cooling air generated by the rotation of the fan assembly becomes very efficient for cooling the heat sink body by modifying the shape of a top plate of the heat sink body, the shape of a radiating fin of the heat sink body, or the installing position of the fan assembly, thereby the cooling efficiency of the fixing wall of the heat sink body is increased within a limited inside space of the electronic apparatus.

Further, according to the present invention, it is possible to install the heat sink in a portable electronic apparatus having a limited internal space, such as a portable personal computer or the like, by modifying the top plate or the cover of the heat sink body.

In this way, the heat sink of the present invention realizes a efficient cooling of the heat producing element in a limited small space. Further, the manufacturing of the heat sink body becomes easy when the heat sink body is assembled by combining the base and the cover.

BRIEF DESCRIPTION OF THE DRAWINGS

The present invention will be more clearly understood from the description as set forth below with reference to the accompanying drawings, wherein:

FIG. 10 is a bottom view of the assembled heat sink having the cover and the base in FIG. 8;

FIG. 11 is a sectional view showing a structure of the heat sink according to a fourth embodiment of the present invention;

DESCRIPTION OF THE PREFERRED EMBODIMENTS

Before describing the preferred embodiments, an explanation will be given of the conventional heat sink.

Figure 1:
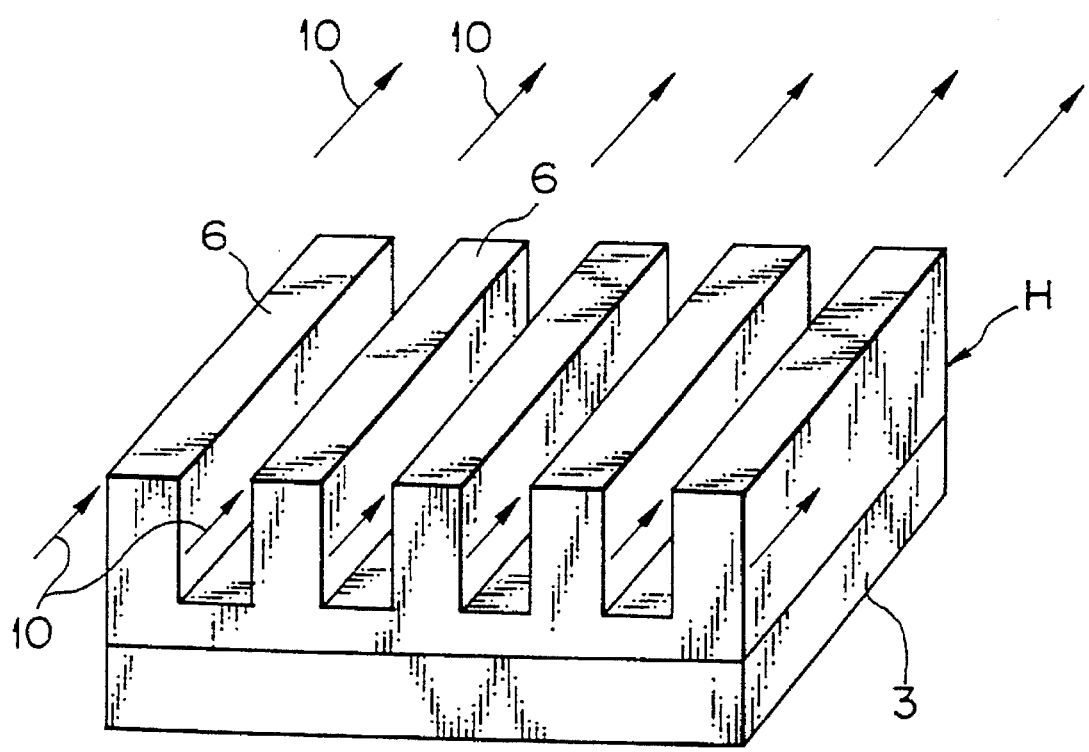
FIG. 1 is a prior art structure of a heat sink.

FIG. 1 shows a conventional heat sink according to a prior art, for cooling a high temperature heat producing element. The heat sink H is made of material such as aluminum having a good heat conductivity. The top face of the heat sink H has a set of radiating fins 6 shaped like a comb. The heat sink H is mounted to the surface of a heat producing element 3 by adhesion or pressure, and is used in the circumstance where a cooling air 10 is forcibly passed through the heat sink H. Heat produced by the element 3 is transferred to the heat sink H and is absorbed by it body or dissipated by the cooling air 10.

However, when the quantity of heat produced by the heat producing element 3 rises in the conventional heat sink, the flow rate of air around the heat sink H must be increased, thereby requiring a powerful fan.

The powerful fan generally requires a large size fan blade or a high rotational speed. This results in increasing a fan installation space and noise.

Preferred embodiments of the present invention will be explained in detail with reference to attached drawings.

FIGS. 2 to 4B show a heat sink H according to the first embodiment of the present invention. The heat sink H comprises a heat sink body 1 made of material such as aluminum having a good heat conductivity, and a fan assembly 2 such as a microfan for air-cooling the heat sink body 1.

The top of the heat sink body i is rectangular. The heat sink body 1 comprises a fixing wall 4 whose back is mounted on a heat producing element 3 with proper means described later, and a top plate 29 supported by upright rectangular bars 7a protruding from four corners of the fixing wall 4, respectively. Ventilation paths 5 are formed between the top plate 29 and the fixing wall 4 and open to the sides of the heat sink H.

Figure 2:
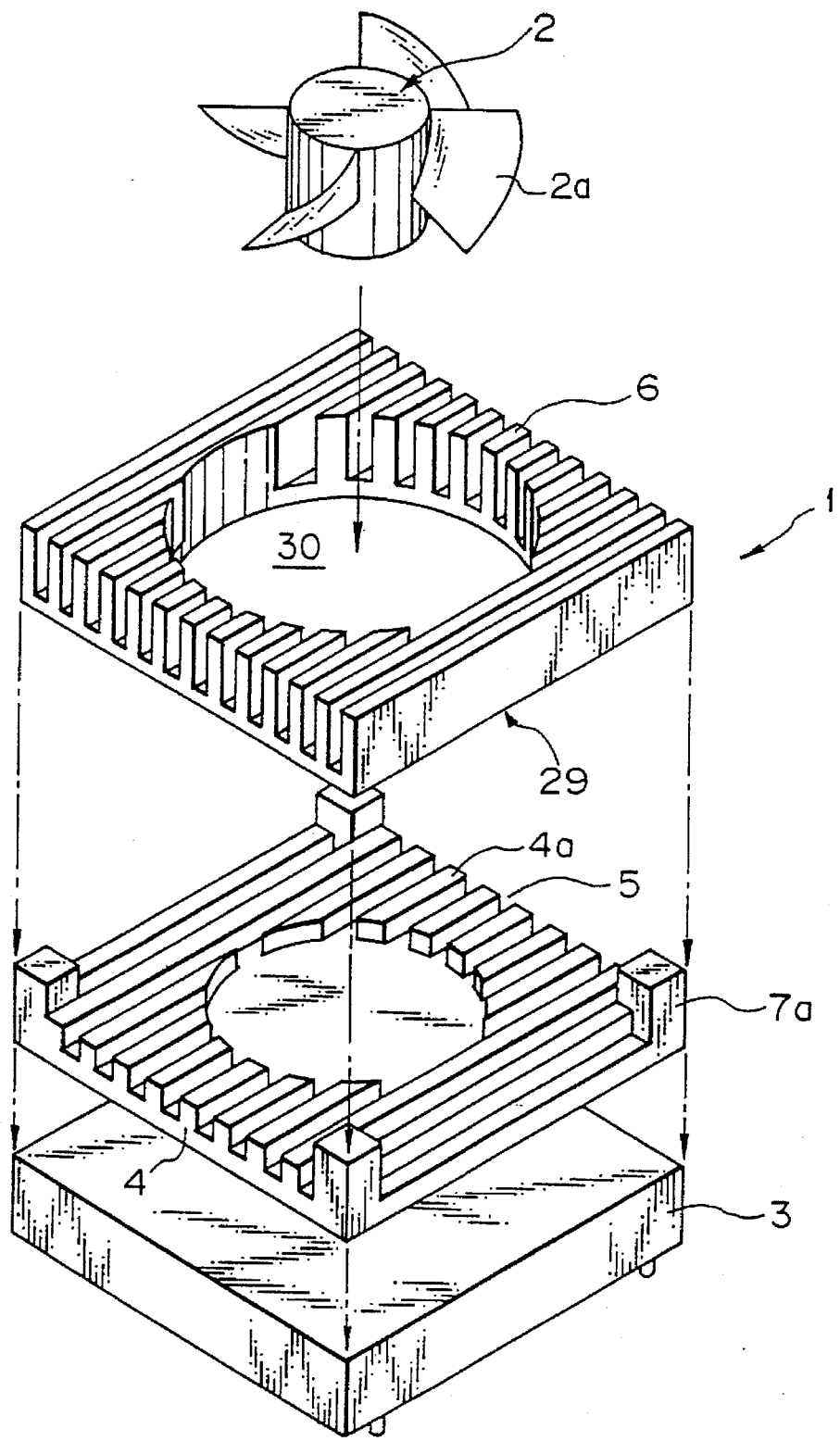
FIG. 2 is a perspective assembly diagram showing a structure of the heat sink according to a first embodiment of the present invention.
Figure 3:
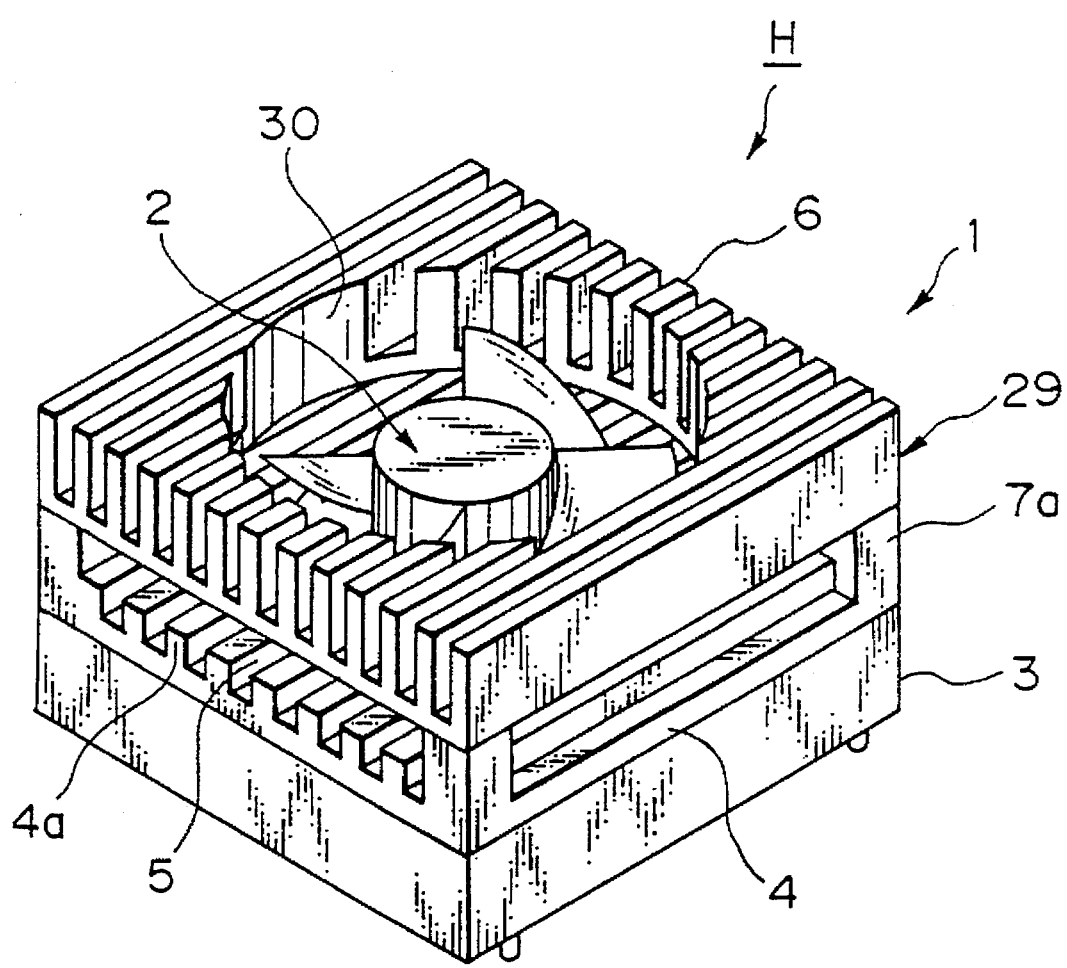
FIG. 3 is a perspective view of the assembled heat sink in FIG. 2.
Figure 4A:
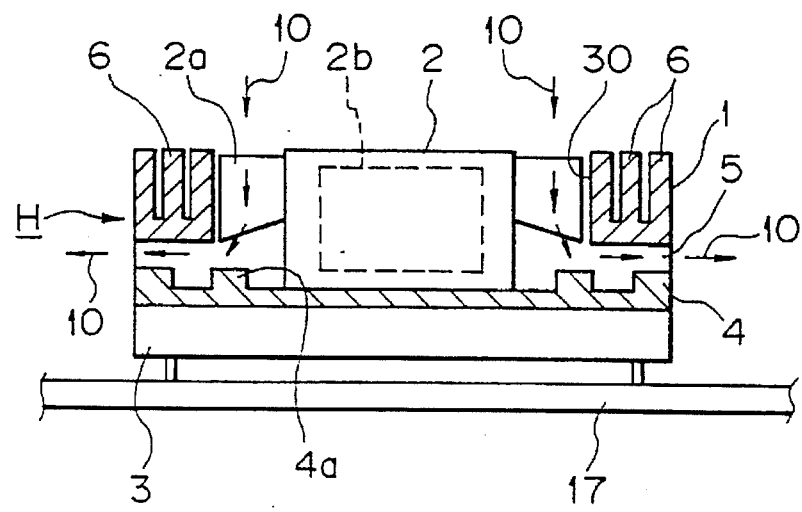
FIG. 4A is a sectional view of the heat sink in FIG. 3 showing an air flow of a cooling air.
Figure 4B:
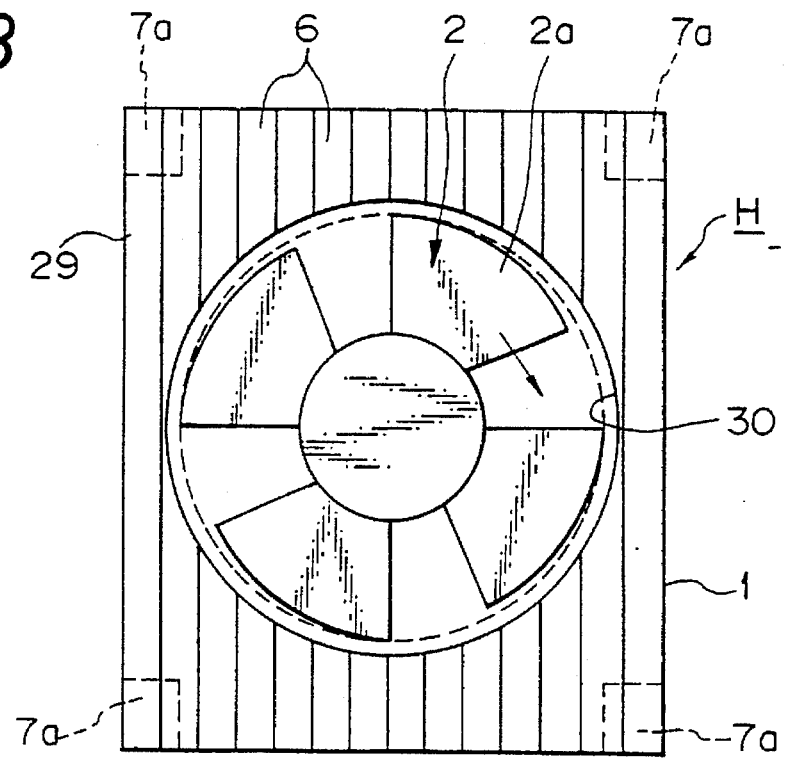
FIG. 4B is a plan view of the heat sink in FIG. 3.

The center of the top plate 29 has a circular hole serving as a fan receiving recess 30 with the fixing wall 4 serving as the bottom thereof. A set of radiating fins 6 shaped like a comb are formed over the top plate 29 and a set of radiating fins 4a also shaped like a comb are formed over the fixing wall 4. The fixing wall 4 and top plate 29 may be separate parts as shown in FIGS. 2 and 3, or be prepared as an integrated part. (not shown).

The fan assembly 2 comprises a drive 2b such as a fan motor disposed in center and a fan blade 2a fixed to a rotary shaft of the fan motor 2b. The fan assembly 2 is disposed in the recess 30. The fan assembly 2 may be prefabricated and attached to the top plate 29 or to the fixing wall 4. Alternatively, a stator of the motor 2a may be integral with the fixing wall 4. The fan assembly 2 may blow air toward the fixing wall 4, or draw air from the ventilation paths 5.

Figure 5:
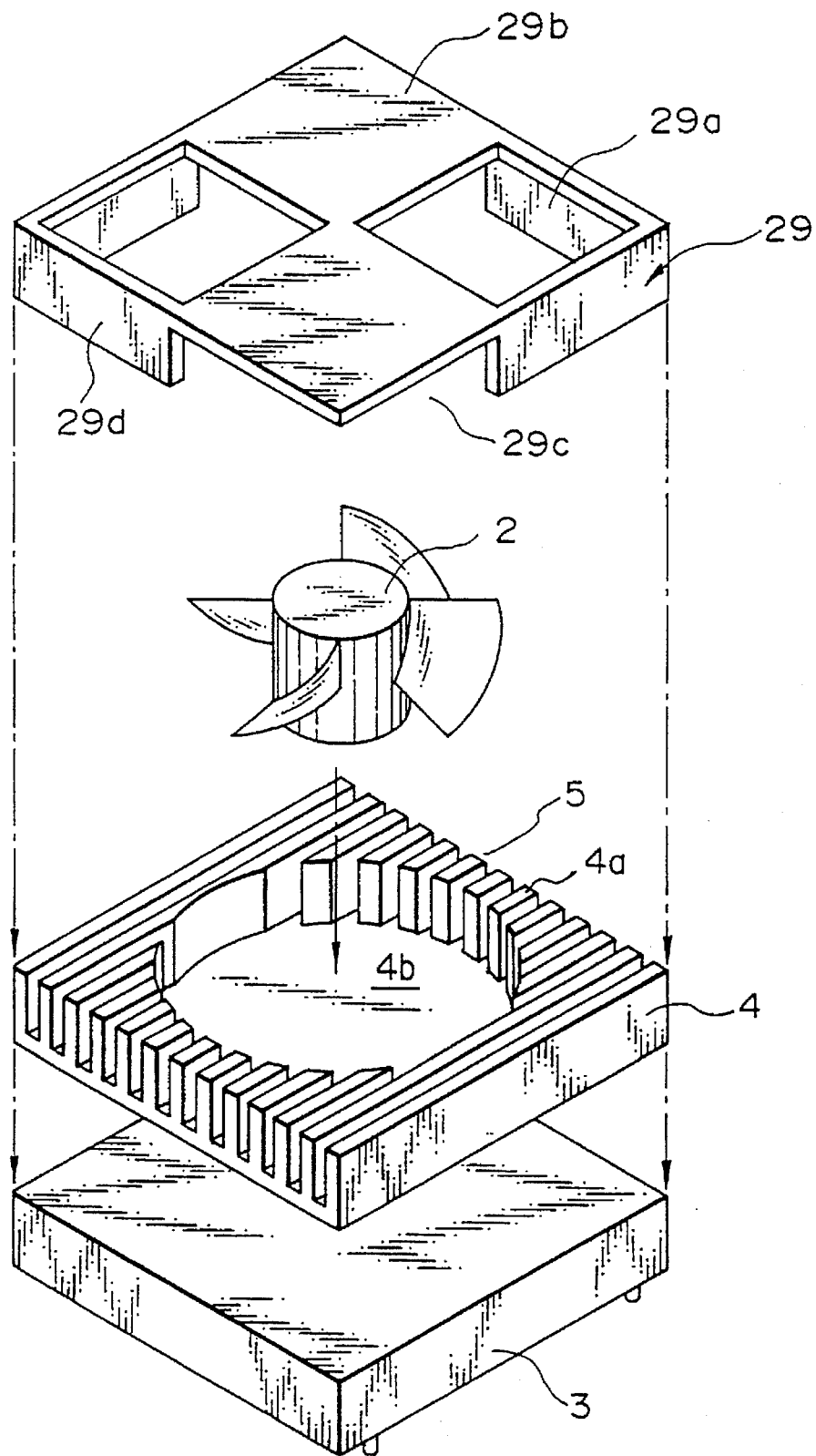
FIG. 5 is a perspective assembly diagram showing a structure of the heat sink according to a second embodiment of the present invention.
Figure 6:
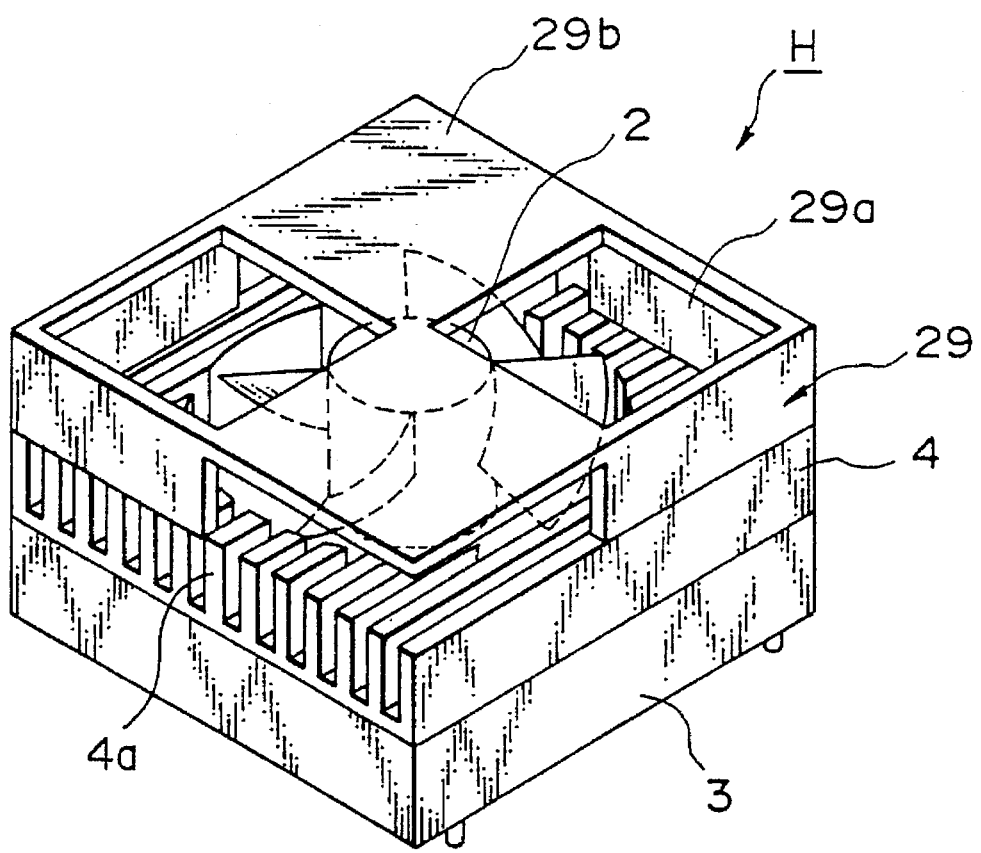
FIG. 6 is a perspective view of the assembled heat sink in FIG. 5.
Figure 7:
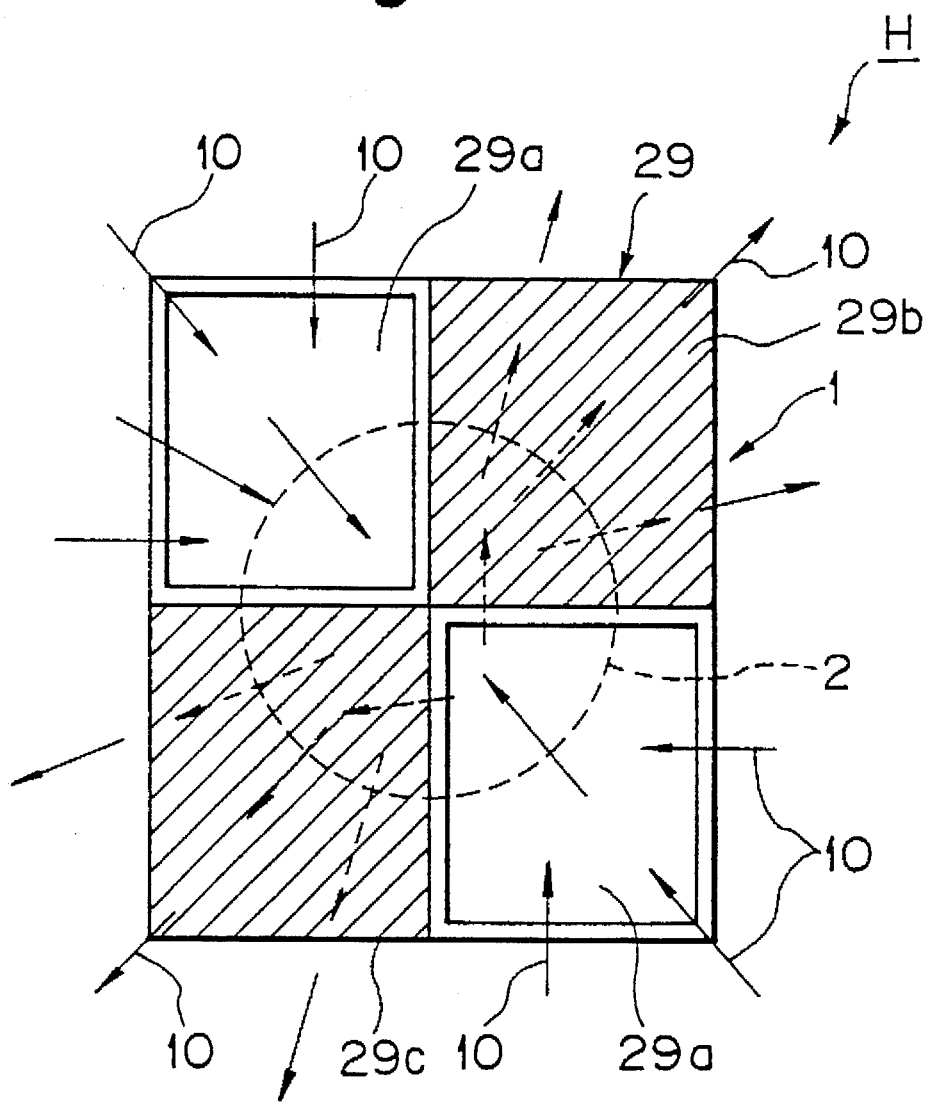
FIG. 7 is a plan view of the heat sink in FIG. 6 showing an air flow of a cooling air.

FIGS. 5 to 7 show a heat sink H according to the second embodiment of the present invention. The top of the heat sink H has four rectangular sections. A diagonally facing pair among the four sections is opened with square openings 29a, and the other pair is closed with lids 29b. Comb-like radiating fins 4a are formed over the fixing wall 4, and the center of fixing wall 4 has a circular recess 4b for receiving the fan assembly 2. Note that the lids 29b are shown in FIG. 7 with hatching. Side walls are extended from the top plate 29 along the periphery of a fixing wall 4. A pair of corners corresponding to the closed sections with the lids 29b have each an opening 29c which opens into an internal ventilation path 5, and another pair of corners corresponding to the open sections with the openings 29a have each a side wall 29d.

According to the heat sink H of the second embodiment constructed above, cooling air 10 is forcibly drawn through the openings 29a of the top plate 29 to cool the fixing wall 4 as indicated with arrow marks in the FIG. 7. The air is then discharged from the ventilation paths 5 through the openings 29c. The heated discharged air ascends along the side walls of a heat sink body 1. This ascending heated air, however, never re-enters the heat sink body 1 because the top face of the top plate 29 above the opening 29c is closed with the lid 6. This results in improving an overall cooling effect.

Figure 8:
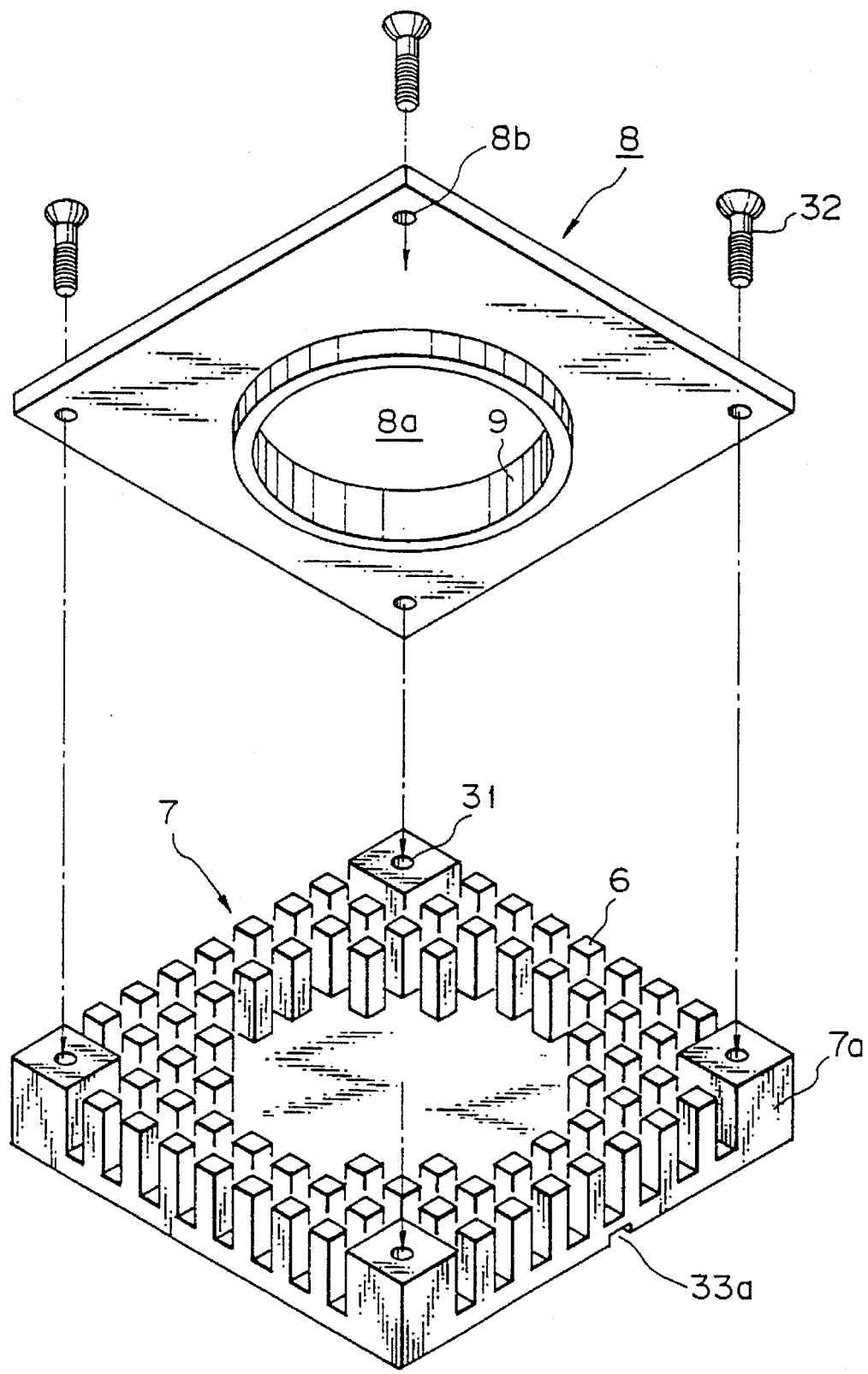
FIG. 8 is a perspective assembly diagram showing a structure of a cover and a base of the heat sink, and a manner of assembling according to a third embodiment of the present invention.
Figure 9A:
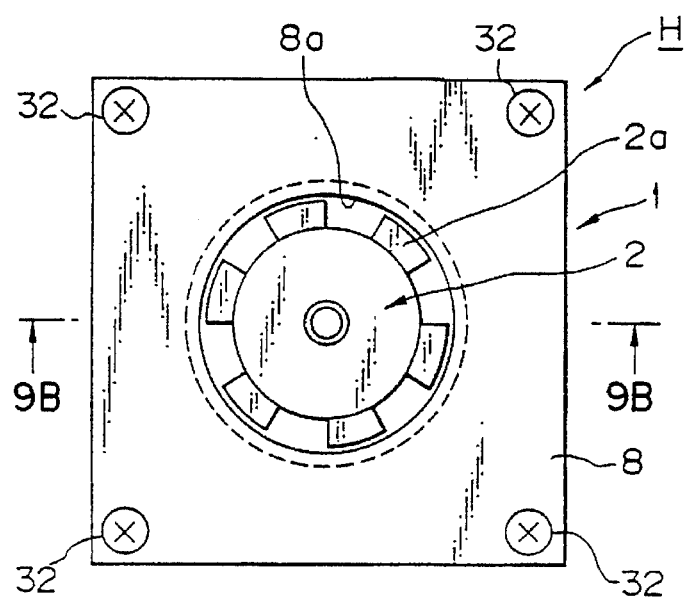
FIG. 9A is a plan view of the assembled heat sink having the cover and the base in FIG. 8.
Figure 9B:
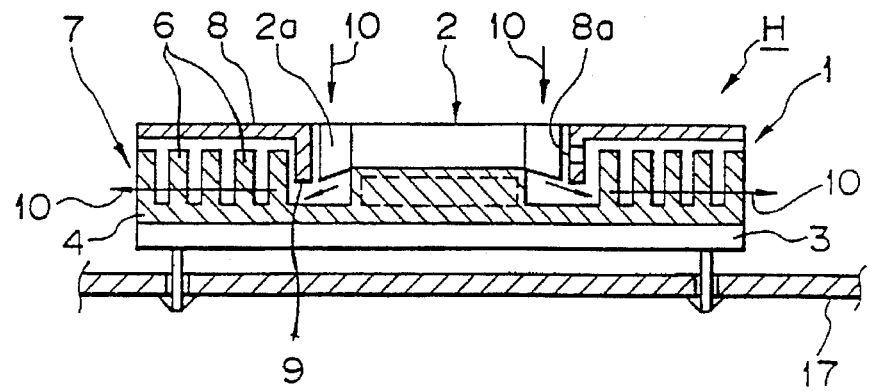
FIG. 9B is a sectional view taken on line B—B in FIG. 9A.

FIGS. 8 to 10 show a heat sink H according to a third embodiment of the present invention. In this embodiment, a heat sink body 1 comprises a base 7 and a cover 8 that are made of material such as aluminum having a good heat conductivity.

The top of the base 7 is rectangular. The base 7 has a set of radiating fins 6 shaped like pins disposed upright around a center space where a fan assembly 2 is disposed, and bars 7a protruding from four corners of the base 7, respectively. The top of each bar 7b has a threaded hole 31, and the cover 8 is fixed to the bars 7b with screws 32 engaging with the threaded holes 31. A lead hole 33 and a lead groove 33a are formed at the bottom of the base 7 as shown in FIGS. 8 and 10. A lead 34 from the fan assembly 2 is guided through the lead groove 33a after penetrated through the lead hole 33 and is connected to a pad of a printed board 17.

The top shape of the cover 8 is identical to that of the base 7. At each corner of the cover 8, a screw hole 8b is formed to pass the screw that engages with the threaded hole 31 of the base 7.

The cover 8 has a center hole 8a for receiving the fan assembly 2 having a fan blade 2a. The periphery of the hole 8a is extended to form a vertical partition 9.

The partition 9 surrounds the fan blade 2a when the cover is fixed on the base 7, to increase the static pressure of cooling air 10 produced by the fan blade 2a.

Figure 12A:
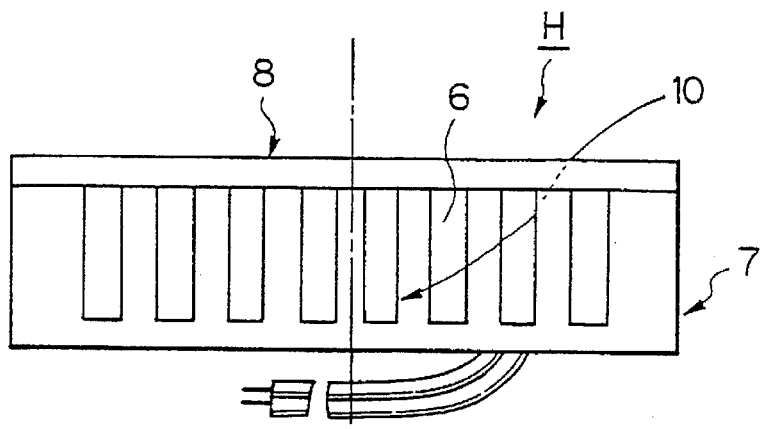
FIG. 12A is a side view of the heat sink in FIG. 11.
Figure 12B:
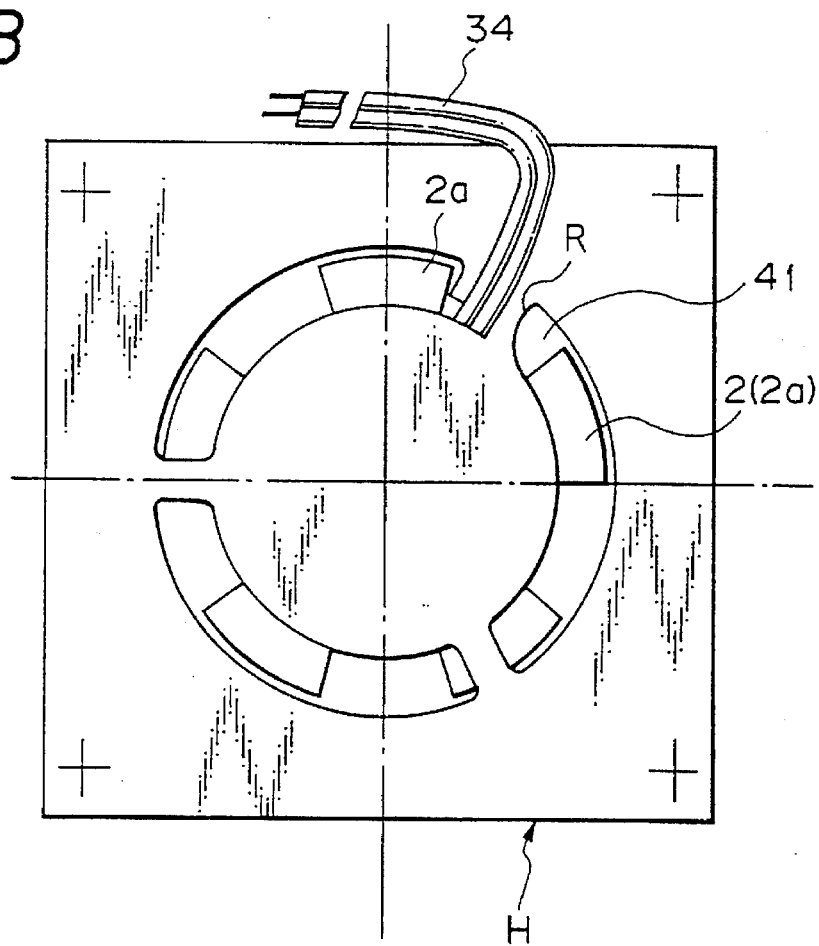
FIG. 12B is a plan view of the heat sink in FIG. 11.

FIGS. 11 to 12B show a heat sink H according to a fourth embodiment of the present invention. In this embodiment, the fan assembly 2 is mounted on the bottom face of the cover 8 to prevent a rise of temperature by the heat conducted from the heat producing element 3 via the base 7 and to prolong the life of the fan motor 2b.

The cover 8 has a fan fixing part 35 at the center part of the bottom face thereof, and the fan assembly 2 is fixed by hanging from the fan fixing part 35. The fan assembly 2 is press fitted to the fan fixing part 35 in this embodiment. The fan assembly 2 comprises a stator 36 having a coil 36a on the outer surface, a shaft 38 vertically disposed at the center of the rotor 36 with a bearing 37, a rotor 39 fixed on the shaft 38 and having magnets 39a on the inner surface of the wall and fan blades 2a on the outer surface of the wall, and a printed circuit board 40 to which a lead 34 is connected.

In FIG. 11, reference numerals 39b denotes a ring yoke, 36b denotes a yoke, 38a denotes a cut washer disposed on the shaft 38, and 38b denotes a spring for pressing the shaft 38 to the upper direction. Also in FIGS. 11, 12A, and 12B, reference 41 denotes a opening for cooling air 10. When cooling air 10 is drawn from the opening 41 as shown by an arrow in FIG. 12A, and is discharged from the side wall of the base 7, it is desirable to form a round corner R on the top end of the partition 9. The round corner R makes the speed of the drawing air constant and decrease the generation of the noise due to the turbulent flow generated by the sharp edge.

Next, the manner of fixing the cover 8 on the base 7 will be explained hereinafter. One example to fix the cover 8 on the base 7 is to use screws 32 as explained before. Other examples to fix the cover 8 on the base 7 are shown in FIGS. 13 to 14B and in FIGS. 15 to 16B.

Figure 13:
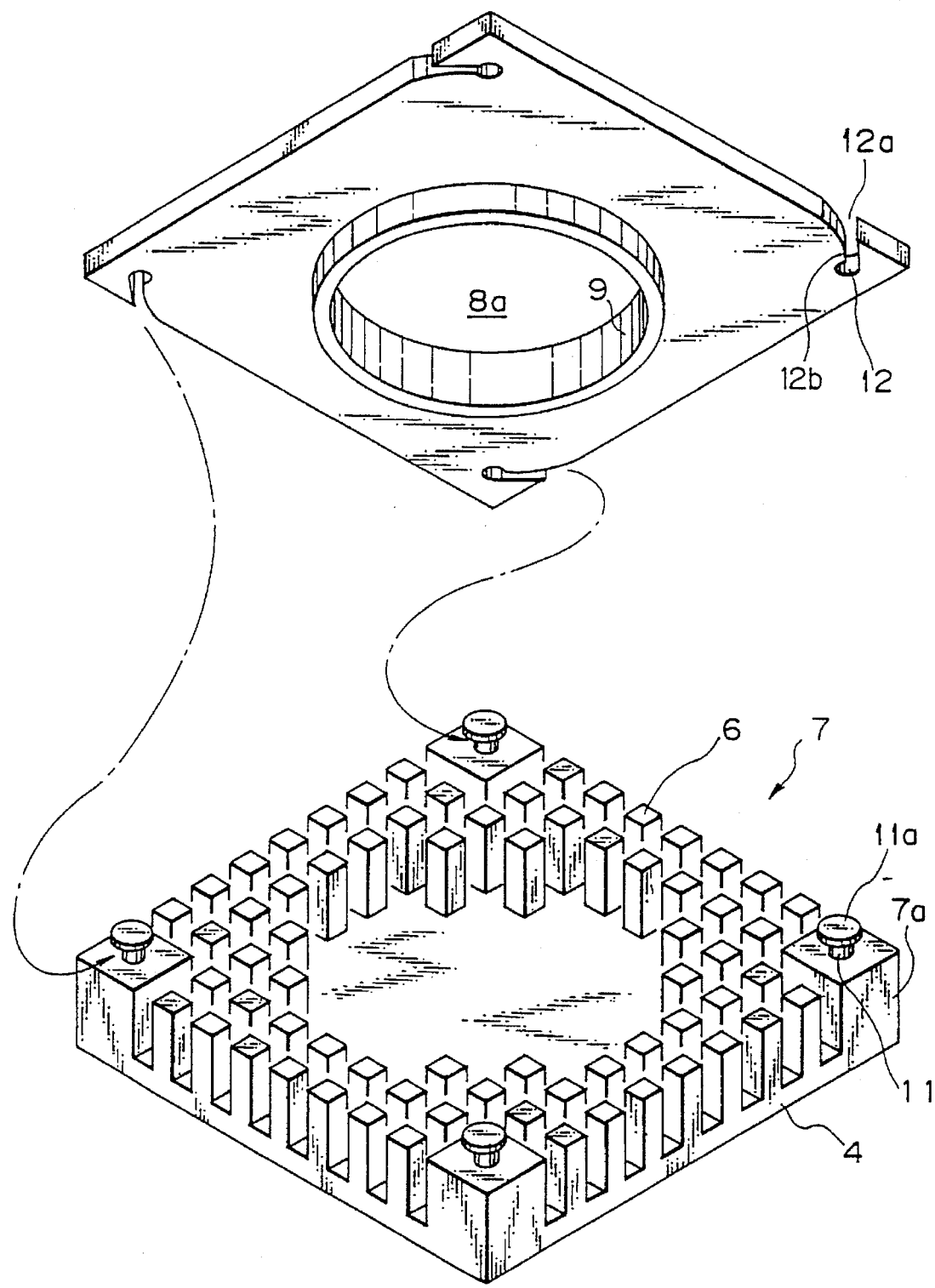
FIG. 13 is a perspective assembly diagram showing a modified structure of a cover and a base of the heat sink in FIG. 8, and a manner of assembling according to the third embodiment of the present invention.
Figure 14A:
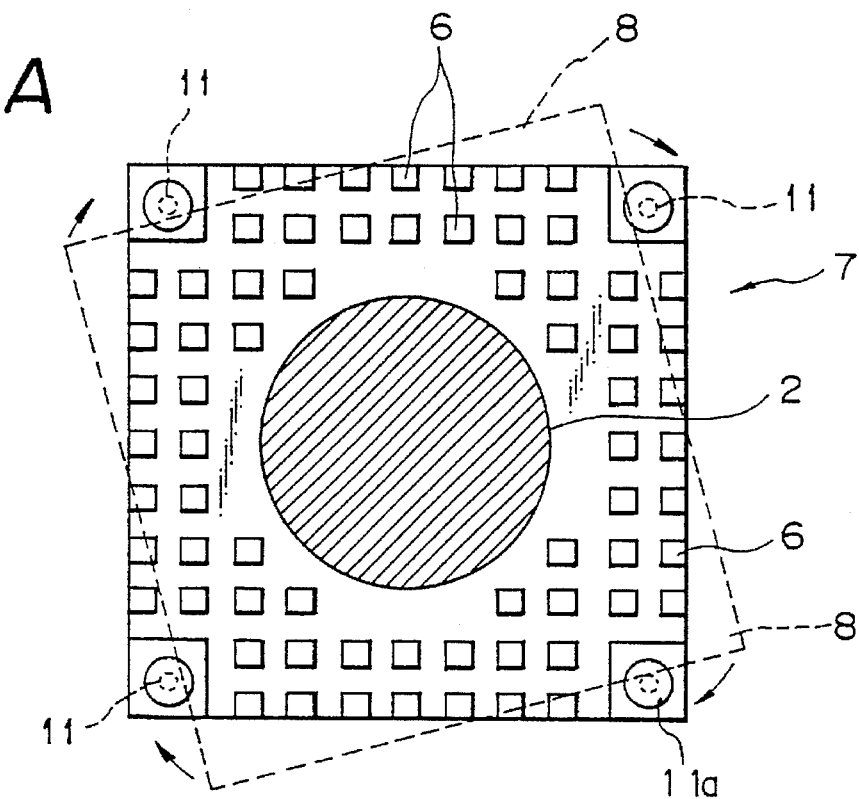
FIG. 14A is a plan view explaining a manner of assembling the cover on the base in FIG. 13.
Figure 14B:
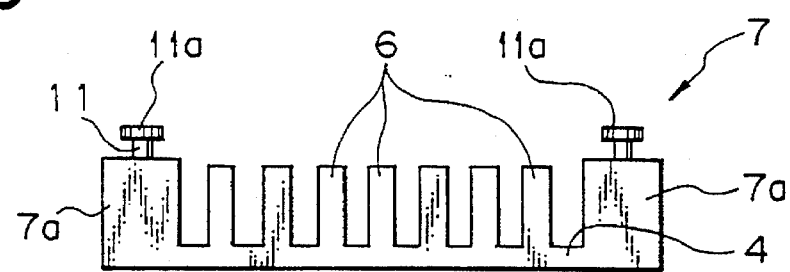
FIG. 14B is a side view of the base in FIG. 13.

In the embodiment shown in FIGS. 13 to 14B, a fastening pin 11 having a head 11a is disposed on each of the top faces of the bars 7a protruding from four corners of the base 7. Correspondingly, a fastening hole 12 is disposed at each of the four corners of the cover 8, and a side of the fastening hole 12 is open to the edge of the cover 8 through the guide channel 12a. The guide channel 12a has a narrow part 12b.

In this embodiment, the cover 8 is set on the base 7 with entrances of the guide channels 12a facing the fastening pins 11 as shown by dotted line in FIG. 14A at first. Then the cover 8 is rotated to a direction indicated by an arrow in FIG. 14A and the pin 11 is led to be fastened in the hole 12 after guided by the guide channel 12a and passed through the narrow part 12b. In this way, the cover 8 is fixed on the base 7.

Figure 15:
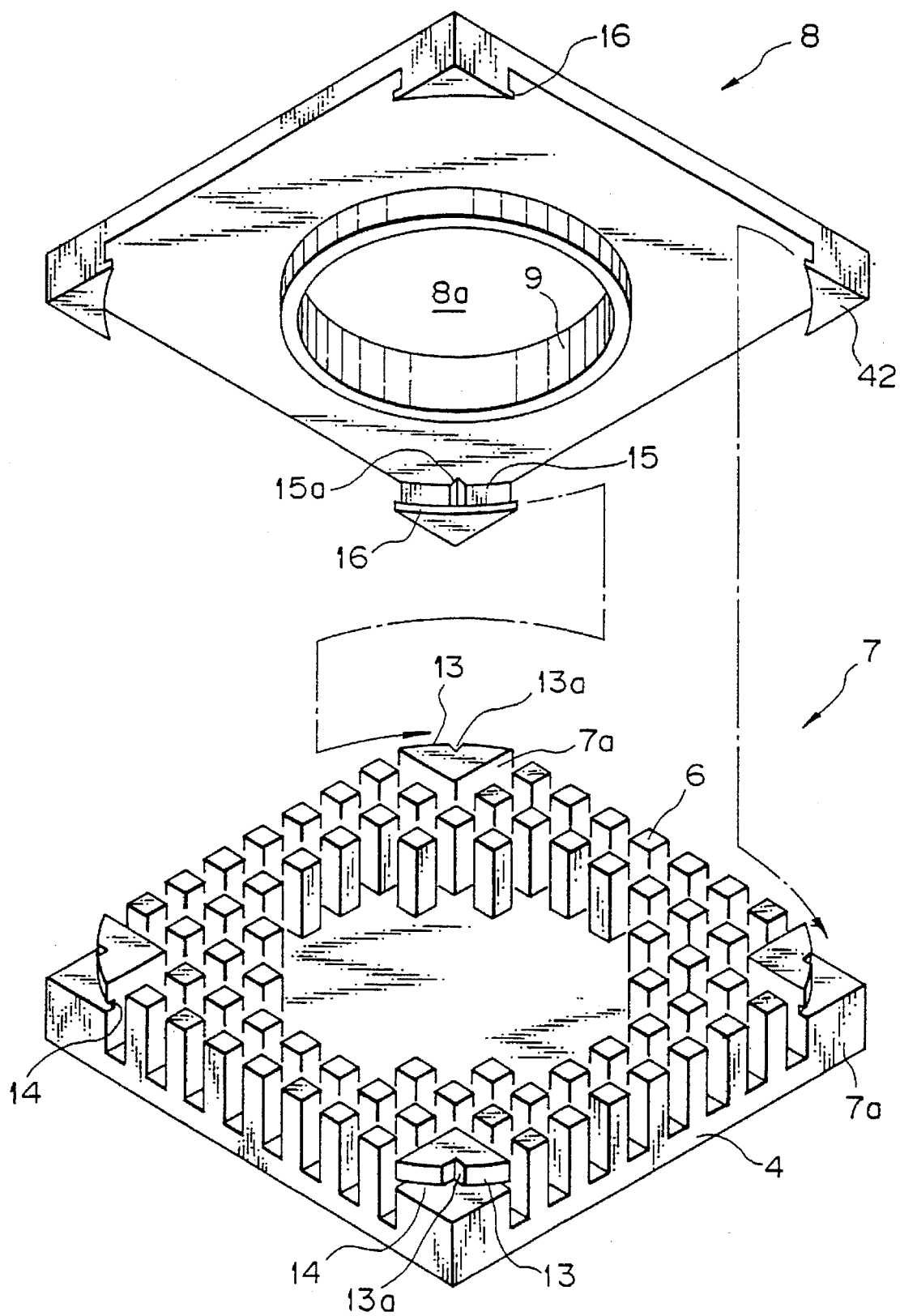
FIG. 15 is a perspective assembly diagram showing another modified structure of a cover and a base of the heat sink in FIG. 8, and a manner of assembling according to the third embodiment of the present invention.
Figure 16A:
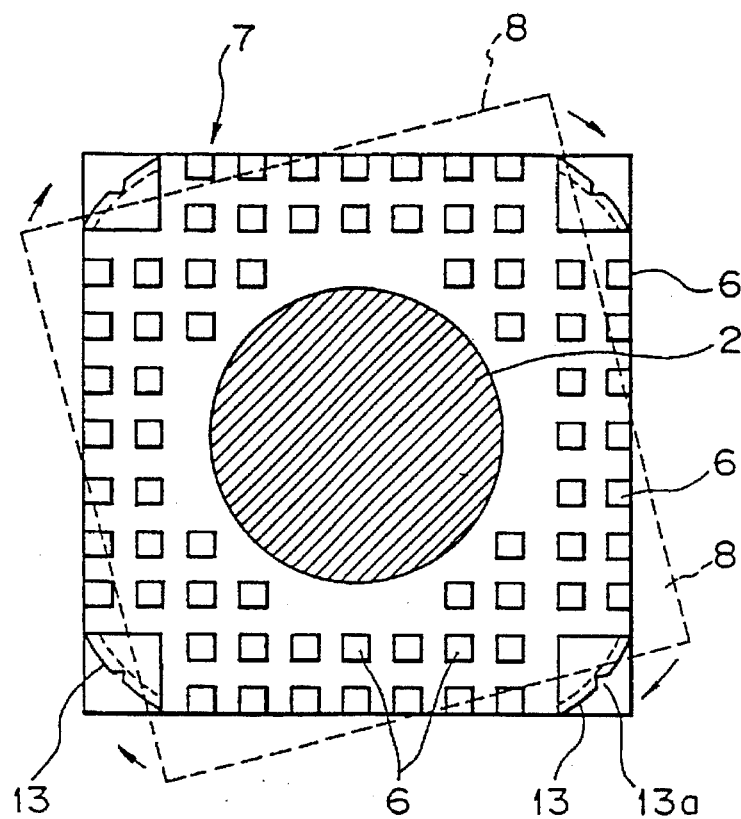
FIG. 16A is a plan view explaining a manner of assembling the cover on the base in FIG. 15.
Figure 16B:
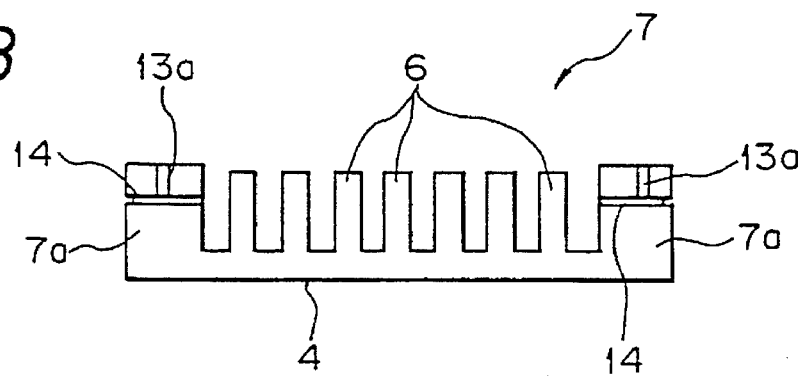
FIG. 16B is a side view of the cover in FIG. 15.

In the embodiment shown in FIGS. 15 to 16B, each of the bars 7a protruding from four corners of the base 7 has a circular arc convex face 13 and a guide groove 14 at an upper part thereof. The guide groove 14 is cut at the base part of the circular arc convex face 13. A center of each circular arc convex face 13 corresponds to the center of the base 7. A hollow notch 13a is disposed on the middle part of each circular arc convex face 13. A curvature of the groove is smaller than that of the circular arc convex face 13 and a center of each groove 14 corresponds to the center of the base 7.

Correspondingly, a projection 42 shaped like a triangle, is disposed at each bottom face of the four corners of the cover 8 as shown in FIG. 15. The projection 42 has a circular arc concave face 15 and a fastening segment 16. The fastening segment 16 is protruded at the free edge of the circular arc concave face 15. A curvature of the fastening segment 16 is smaller than that of the circular arc concave face 15 and a center of each fastening segment 16 and a center of each circular arc concave face 15 correspond to the center of the cover 8.

The circular arc concave face 15 faces to the circular arc convex face 13, and the fastening segment 16 faces to the guide groove 14 when the cover 8 is fixed on the base 7. Further, a protruding portion 15a for fitting the hollow notch 13a of the base 7 is disposed on the middle part of each circular arc concave face 15.

In this embodiment, the cover 8 is set on the base 7 with its protruding portion 15a engaged to the guide groove 14 of the base 7 as shown by doted line in FIG. 16A at first. Then the cover 8 is rotated to a direction indicated by an arrow in FIG. 16A and the protruding portion 15a is led to be fastened in the hollow notch 13a after sliding on the circular arc convex face 13. In this way, the cover 8 is fixed on the base 7.

When an obstacle such as a printed board is disposed over the heat sink H as constructed above and upper space of the cover 8 is very narrow, the air flow to the cooling air to the fan assembly 2 or from the fan assembly 2 is reduced due to an increase an air pressure loss, thereby decreasing the cooling capacity of the fan assembly 2 since the amount of air flowing to or from the fan assembly decreases.

FIGS. 17A to 20 are examples of the structure of the cover 8 when the heat sink H is uses in the above mentioned condition.

Figure 17A:
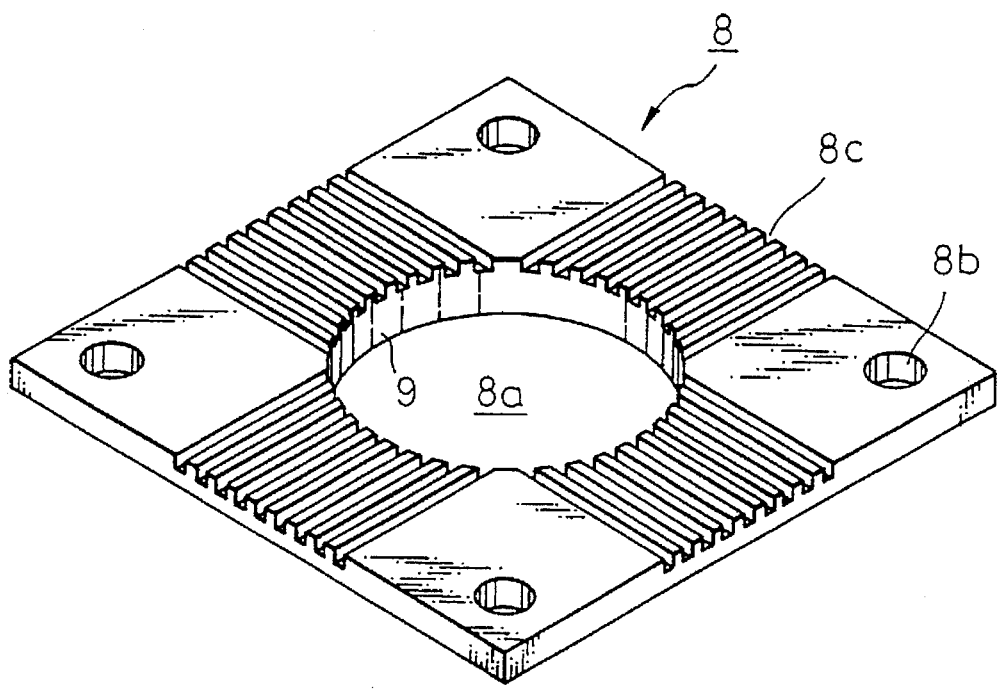
FIG. 17A is a perspective view of the cover in FIG. 8 having a plurality of grooves crosswisely excavated on the top face.
Figure 17B:
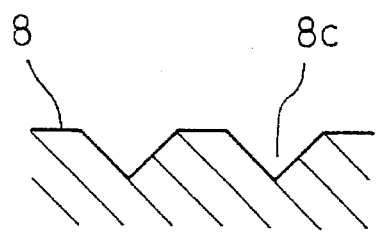
FIGS. 17B and 17C are enlarged sectional view showing other shapes of the groove in FIG. 17A.
Figure 17C:
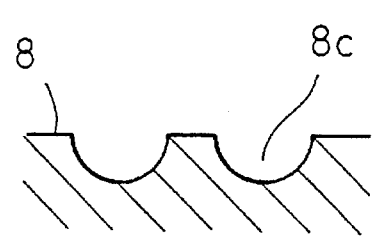

The cover 8 shown in FIG. 17A has cooling grooves 8c cut crosswise on the top face thereof across the recess 8a. The cross section of the cooling grooves 8c in this embodiment is rectangular and each of the cooling grooves 8c is laid between the opposite sides of the cover 8. Note that the shape of the cross section of the grooves 8c is not limited by rectangular. The other usable shape of the grooves 8c are, for example, a V shape as shown in FIG. 17B or a U shape as shown in FIG. 17C. The cooling grooves 8c disposed on the upper face of the cover 8 can increase a space of the upper area of the cover 8.

Figure 18A:
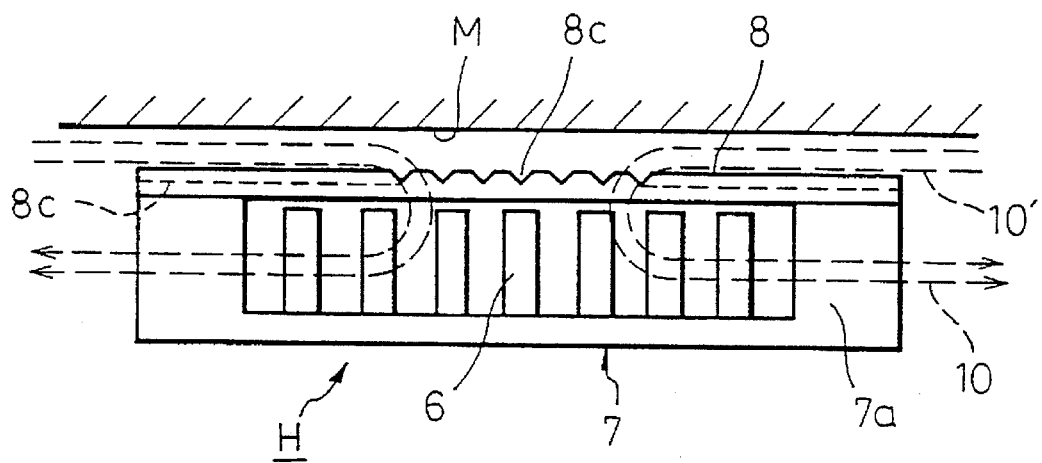
FIG. 18A is an explanatory view showing an air flow condition of the cooling air when the cover has grooves on the top face.
Figure 18B:
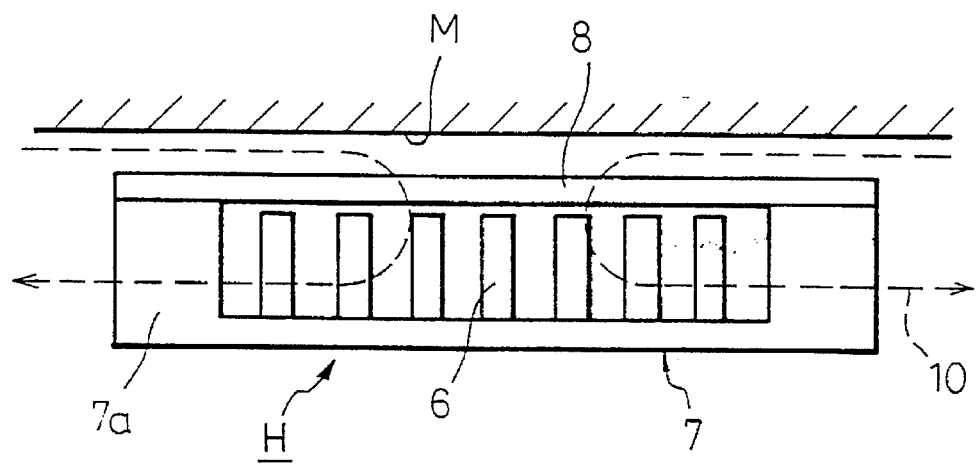
FIG. 18B is an explanatory view showing an air flow condition of the cooling air when the cover has no grooves on the top face.

FIG. 18A shows an air flow of the upper space of the cover 8 having grooves 8c as shown in FIG. 17A, and FIG. 18B shows an air flow of the upper space of the cover 8 having no grooves 8c when a shielding member M is disposed over the cover 8. The heat sink 8 having no grooves 8c on the top face of the cover 8 as shown in FIG. 18B is cooled only by the cooling air 10. Contrary to this, the heat sink 8 having grooves 8c on the top face of the cover 8 as shown in FIG. 18A is cooled not only by the cooling air 10 but a new cooling air 10' flowing in the grooves 8c. As a result, heat conducted from the bar 7a supporting the cover 8 is efficiently dissipated from the heat sink H by the cooling air 10' flowing in the grooves 8c on the top face of the cover 8. In this way the grooves 8c assists cooling the cover 8.

Figure 19A:
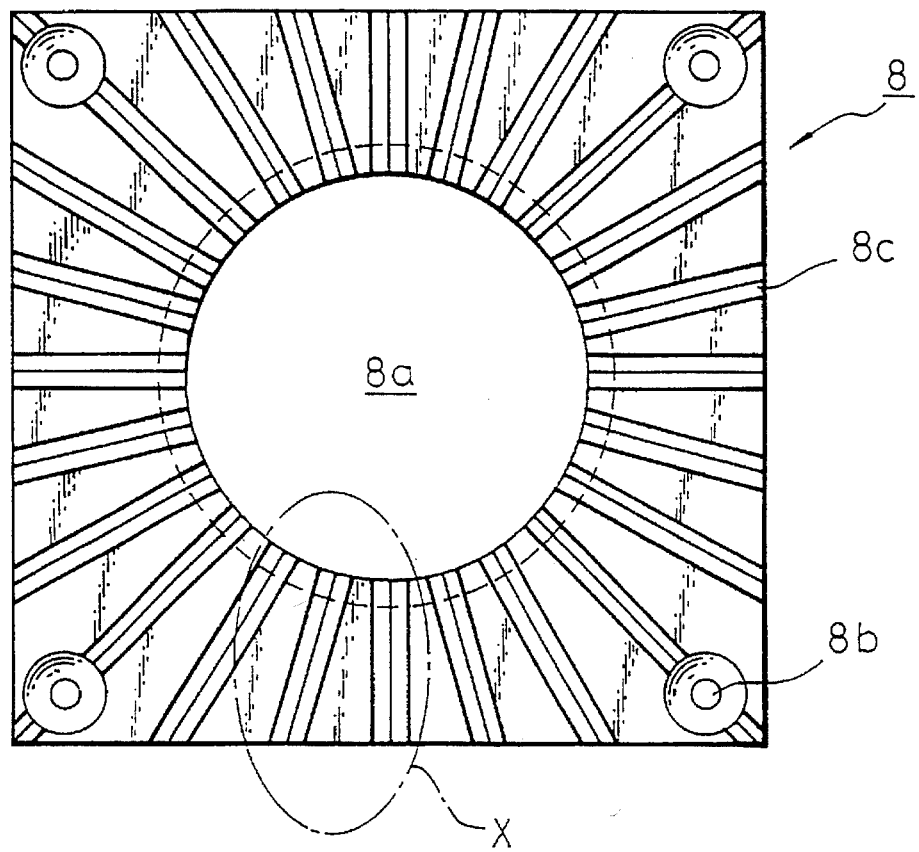
FIG. 19A is a plan view of the cover in FIG. 8 having a plurality of grooves radially excavated on the top face thereof.
Figure 19B:
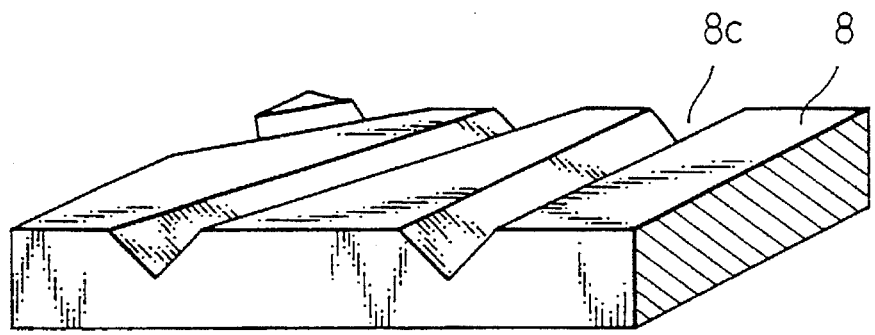
FIG. 19B is an enlarged perspective view of a part X in FIG. 19A.

FIG. 19A is a plan view of the cover 8 showing another example having a plurality of grooves 8c on the top face thereof, and FIG. 19B is an enlarged perspective view of a part X in FIG. 19A. In FIG. 19A, The grooves 8c are cut on the top face of the cover 8 radially from the center of hole 8a for receiving the fan assembly 2. The sectional shape of the grooves 8c in this embodiment is V, but the shape thereof is not limited by this embodiment. The sectional shape of the 8c may rectangular or U, as explained before.

Figure 20A:
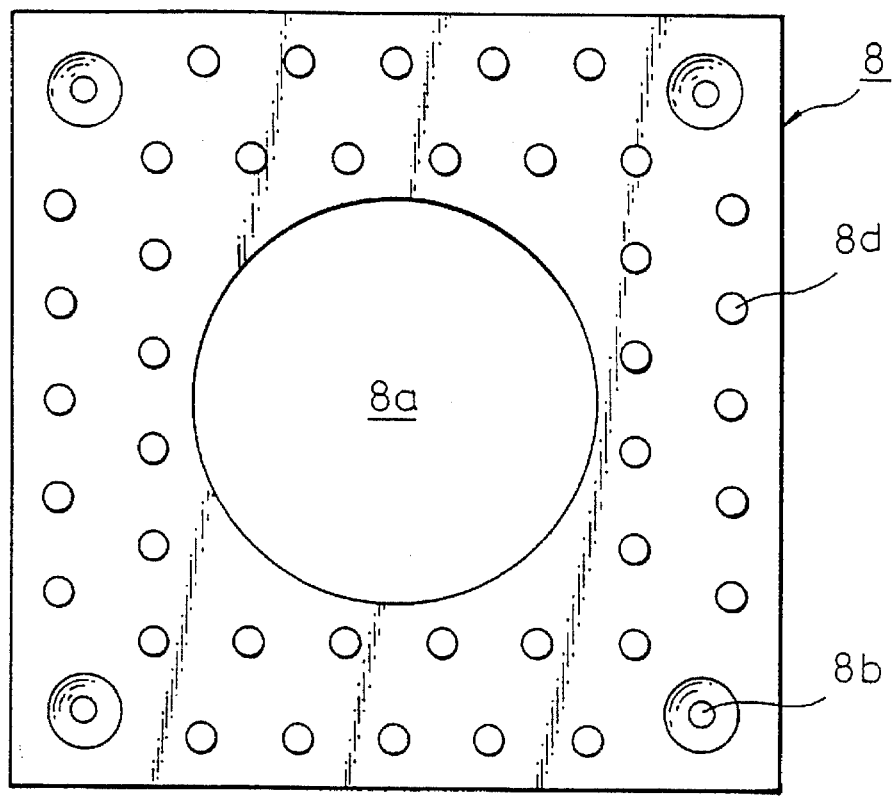
FIG. 20A is a plan view of the cover in FIG. 8 having a plurality of radiation pins on the top face thereof.
Figure 20B:
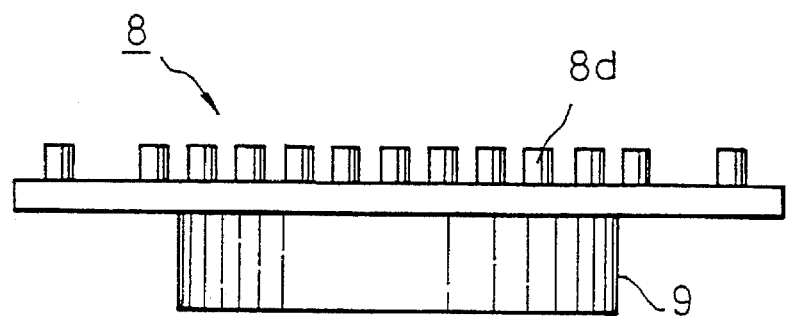
FIG. 20B is a side view of the cover in FIG. 20A.

FIG. 20A is a plan view of the cover 8 showing other example having a plurality of radiating pins 8d on the top face thereof, and FIG. 20B is a side view of the cover 8 in FIG. 20A. The radiating pins 8d in this embodiment is formed by decreasing the thickness of the cover 8 making the total thickness of the cover 8 equal to that of the cover 8 in FIG. 8.

The cover 8 is cooled effectively by forming the radiating pins 8d on the top face thereof decreasing the thickness of the cover 8 instead of excavating the cooling grooves 8c thereon. As a result, heat conducted from the bar 7a supporting the cover 8 is efficiently dissipated by the cooling air 10' flowing among the pins 8d on the top face of the cover 8. In this way the radiating pins 8d assist the cooling of the cover 8.

The cover 8 having the cooling grooves 8c or the radiating pins 8d is effectively cooled by the additional cooling air 10' when the cover 8 is disposed in the condition where a little space is kept over the heat sink H by enlarging the space by the grooves 8c or the pins 8d. Though this effect is small when the cover 8 having the cooling grooves 8c or the radiating pins 8d is disposed in the condition where a large space is kept over the heat sink H.

Figure 21:
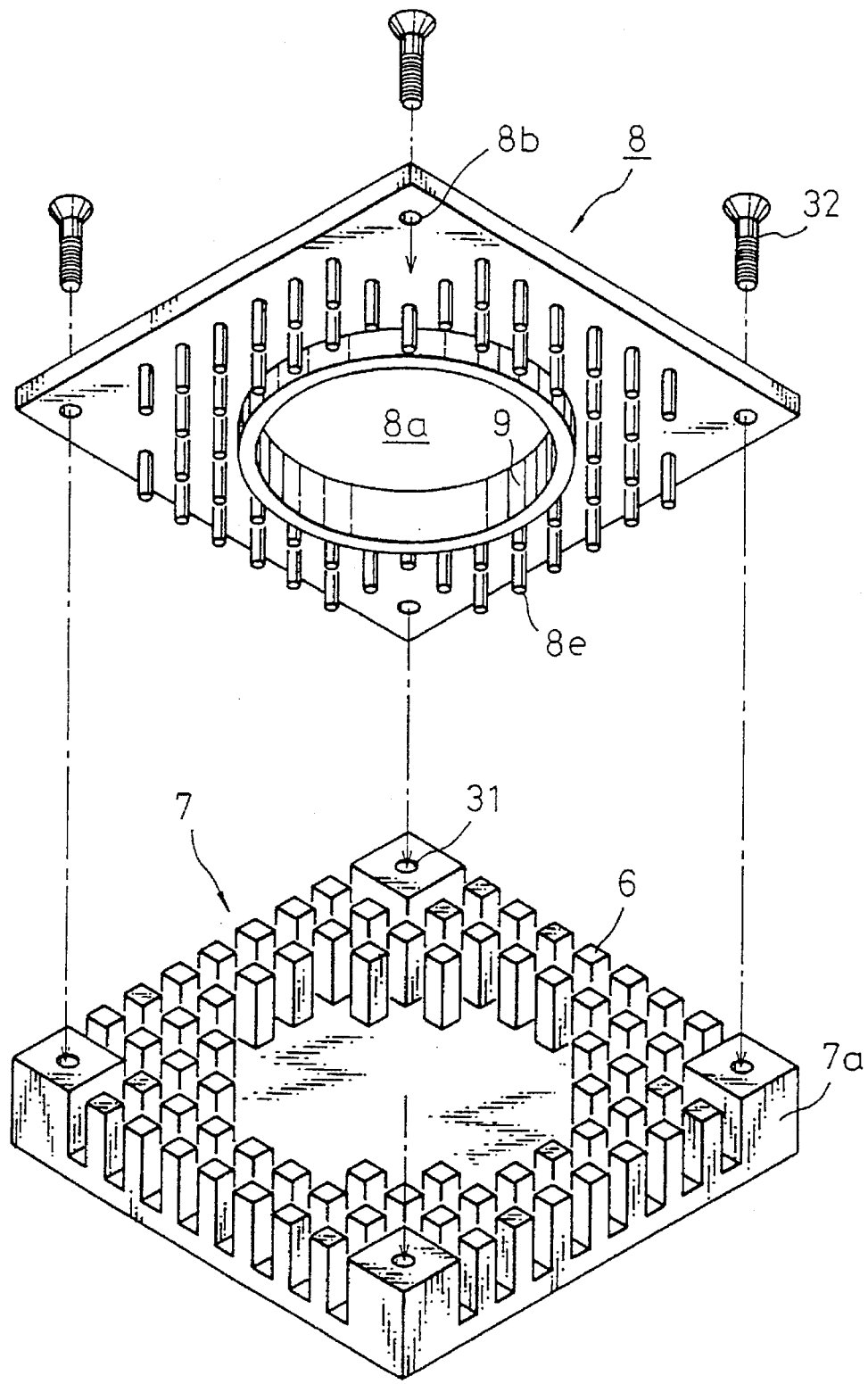
FIG. 21 is a perspective assembly diagram showing a structure of a cover and a base of the heat sink, and a manner of assembling according to a fifth embodiment of the present invention wherein radiation pins are disposed on the bottom face of the cover.

FIG. 21 is a perspective assembly diagram showing a structure of a cover 8 and a base 7 of the heat sink H, and a manner of assembling according to a fifth embodiment of the present invention. The heat sink H in this embodiment uses the same base 7 explained as the third embodiment in FIG. 8, but the cover 8 is different from the third embodiment. The cover 8 in this embodiment has radiating pins 8e on the bottom face thereof, though the the bottom face of the third embodiment is flat.

Figure 22:
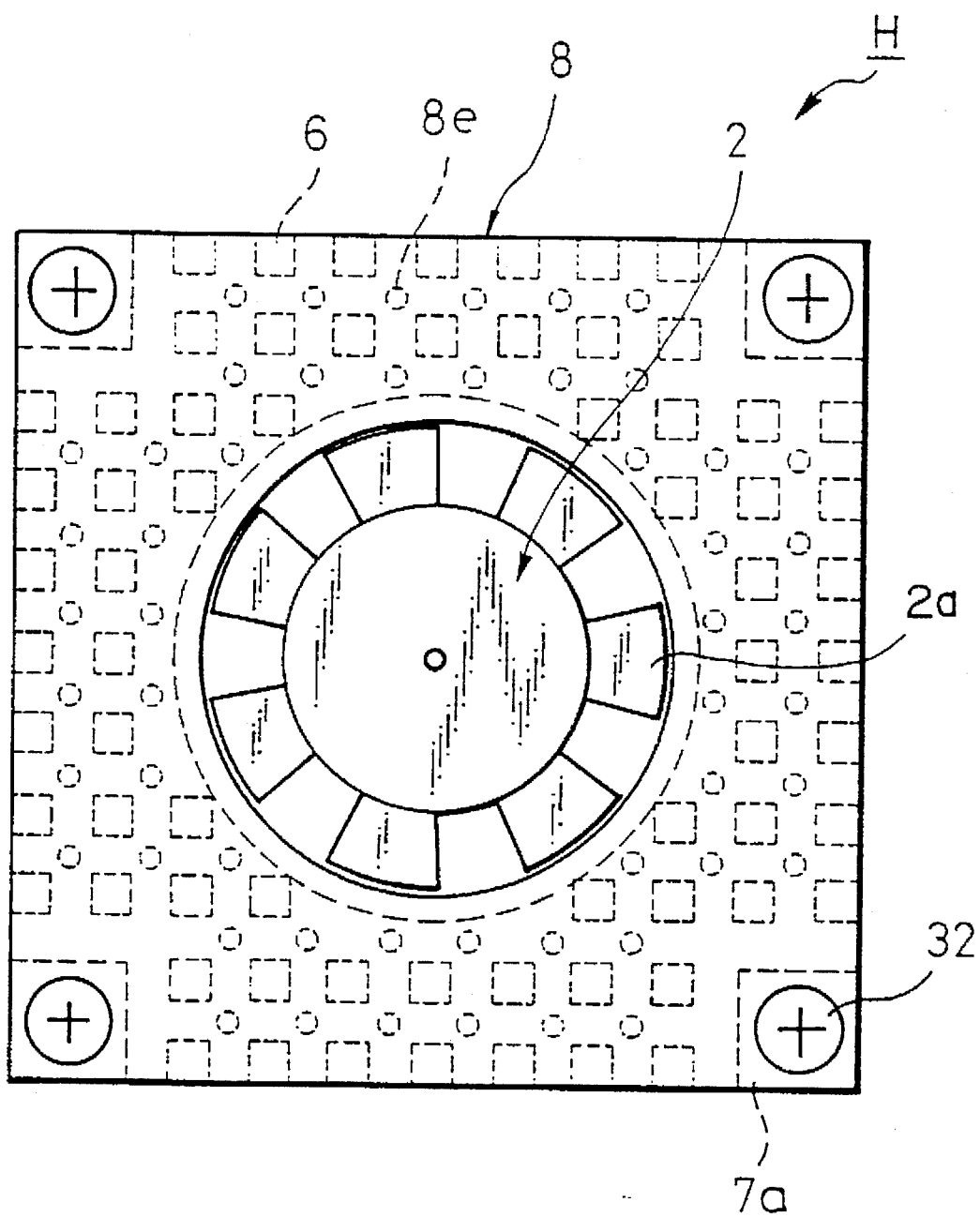
FIG. 22 is a perspective plan view of the assembled heat sink having the cover and the base in FIG. 21.

The radiating pin 8e in this embodiment is a circular pole and the diameter thereof is half the width of the radiating fin 6 projected on the base 7. However, the shape of the radiating pin 8e is not limited by the circular pole. The radiating pin 83 may be a triangular pole or a square pole. The positions of the radiating pins 8e on the cover 8 are shown in FIG. 22. The radiating pins 8e projected into the center of the space surrounded by the radiating fins 6 when the cover 8 is fixed on the base 7 by the screws 32.

Figure 23A:
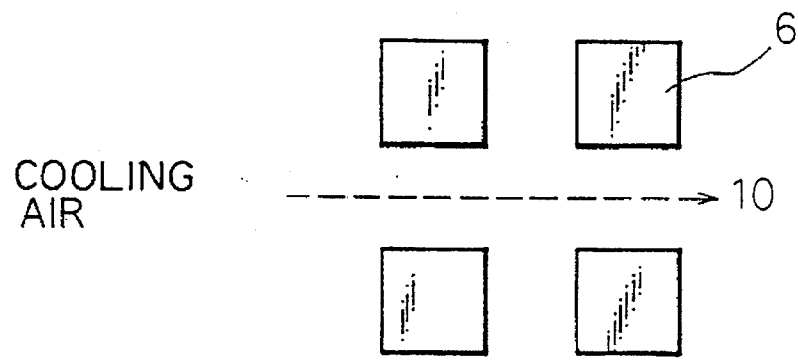
FIG. 23A is an explanatory view showing an air flow condition of the cooling air when the cover has no radiation pins on the bottom face thereof.
Figure 23B:
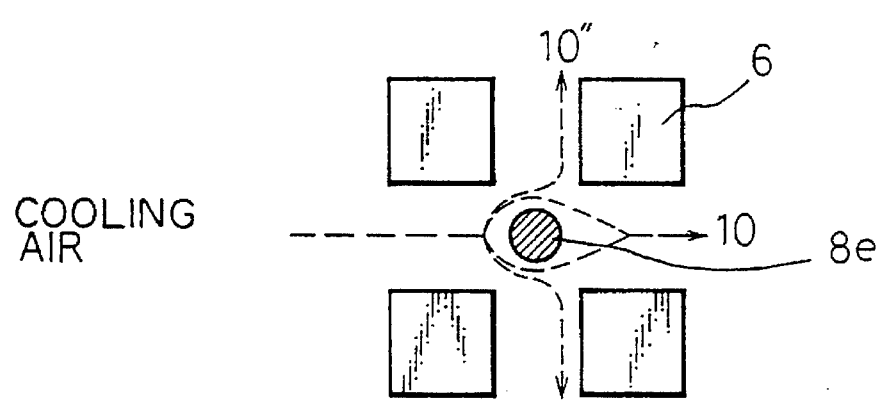
FIG. 23B is an explanatory view showing an air flow condition of the cooling air when the cover has the radiation pins on the bottom face thereof.

FIGS. 23A and 23B show a difference of an air flow of the cooling air 10 between the cover 8 having radiating pins 8e and having no radiating pins 8e on the bottom face thereof. The cooling air 10 flows straight passing a side face of the radiating fin 6 when no pins are disposed therebetween as shown in FIG. 23A. Contrary to this, when the pins 8e are disposed between the radiating fins 6, an air flow of the cooling air 10 is diffused by the radiating pin 8e and is passing not only a side face but also a front and a back faces of the radiating fin 6 as shown by reference 10" in FIG. 23B.

Figure 24A:
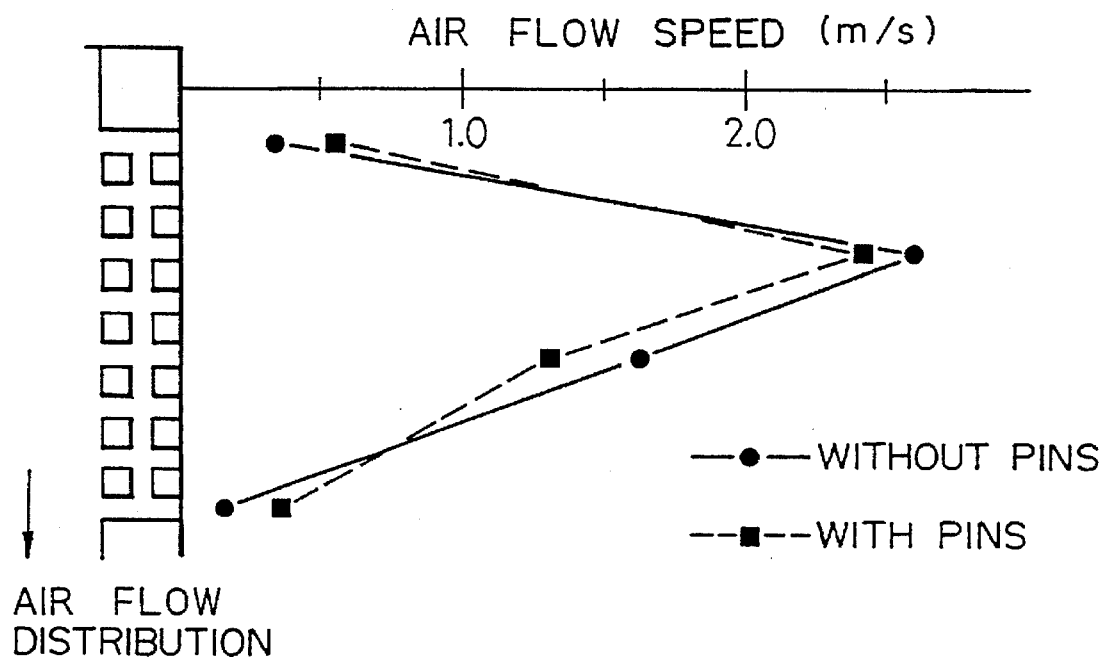
FIG. 24A is a diagram showing a wind speed distribution when the cover has the radiation pins on the bottom face thereof in comparison with the same when the cover has no radiation pins on the bottom face thereof.

FIG. 24A is a diagram showing an air flow speed and an air flow distribution characteristic. In FIG. 24A, black circles show the characteristic when the cover 8 has no radiating pins on the bottom face thereof, and black squares show the characteristic when the cover 8 has the radiating pins 8e on the bottom face thereof.

Figure 24B:
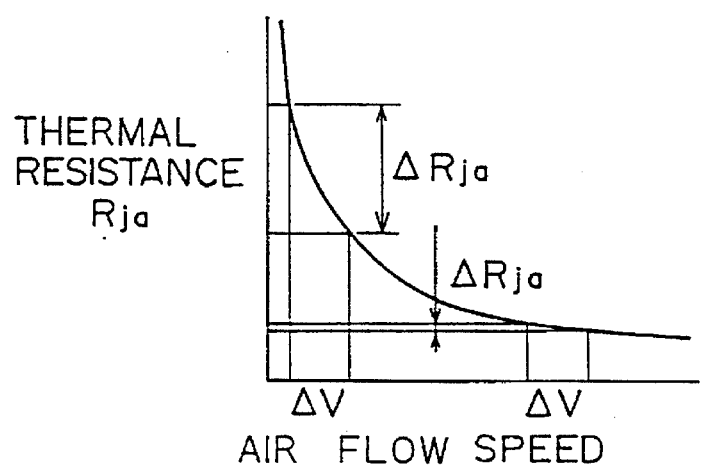
FIG. 24B is a diagram showing a characteristic between a wind speed and a heat resistance.

FIG. 24B is a diagram showing the relationship between air flow speed and thermal resistance. As is shown in FIG. 24B, an increment ΔRja of the thermal resistance Rja per unit voltage ΔV becomes smaller in accordance with the increment of the air flow speed. Accordingly, cooling efficiency will be improved by distributing the cooling air 10 from the area where a high speed cooling air is flowing to the area where a low speed cooling air is flowing.

In this way, the air flow distribution of the cooling air 10 becomes diffuse and the air flow speed at the center part is decreased in the heat sink H of the fifth embodiment having the radiating pins 8d on the bottom face of the cover 8, as compared with the heat sink H having no radiating pins on the bottom face of the cover 8. As a result, an air flow speed of the cooling air 10 is increased at the side part of the heat sink H, thereby a cooling efficiency of the heat sink H of the fifth embodiment is increased.

Figure 25:
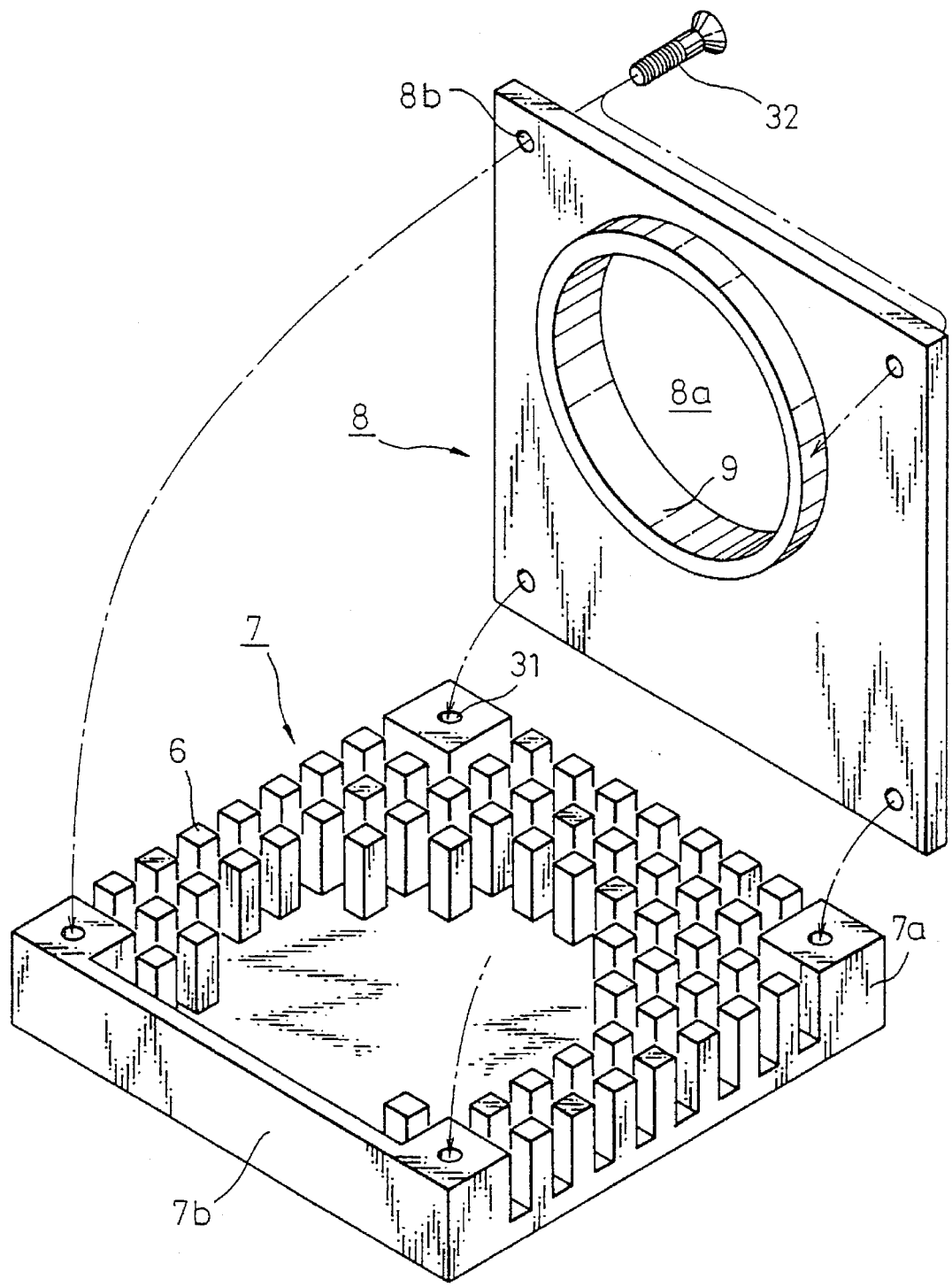
FIG. 25 is a perspective assembly diagram showing a structure of a cover and a base of the heat sink, and a manner of assembling according to a sixth embodiment of the present invention wherein a fan assembly is disposed offset to one of the side of the heat sink.

FIG. 25 is a perspective assembly diagram showing a structure of a cover 8 and a base 7 of the heat sink H, and a manner of assembling according to a sixth embodiment of the present invention. The fan assembly 2 is installed at the center of the heat sink H in the embodiment as explained in FIGS. 8 to 10. Contrary to this, the fan assembly 2 is disposed offset to one of the side of the heat sink H from the center in this embodiment.

Figure 26:
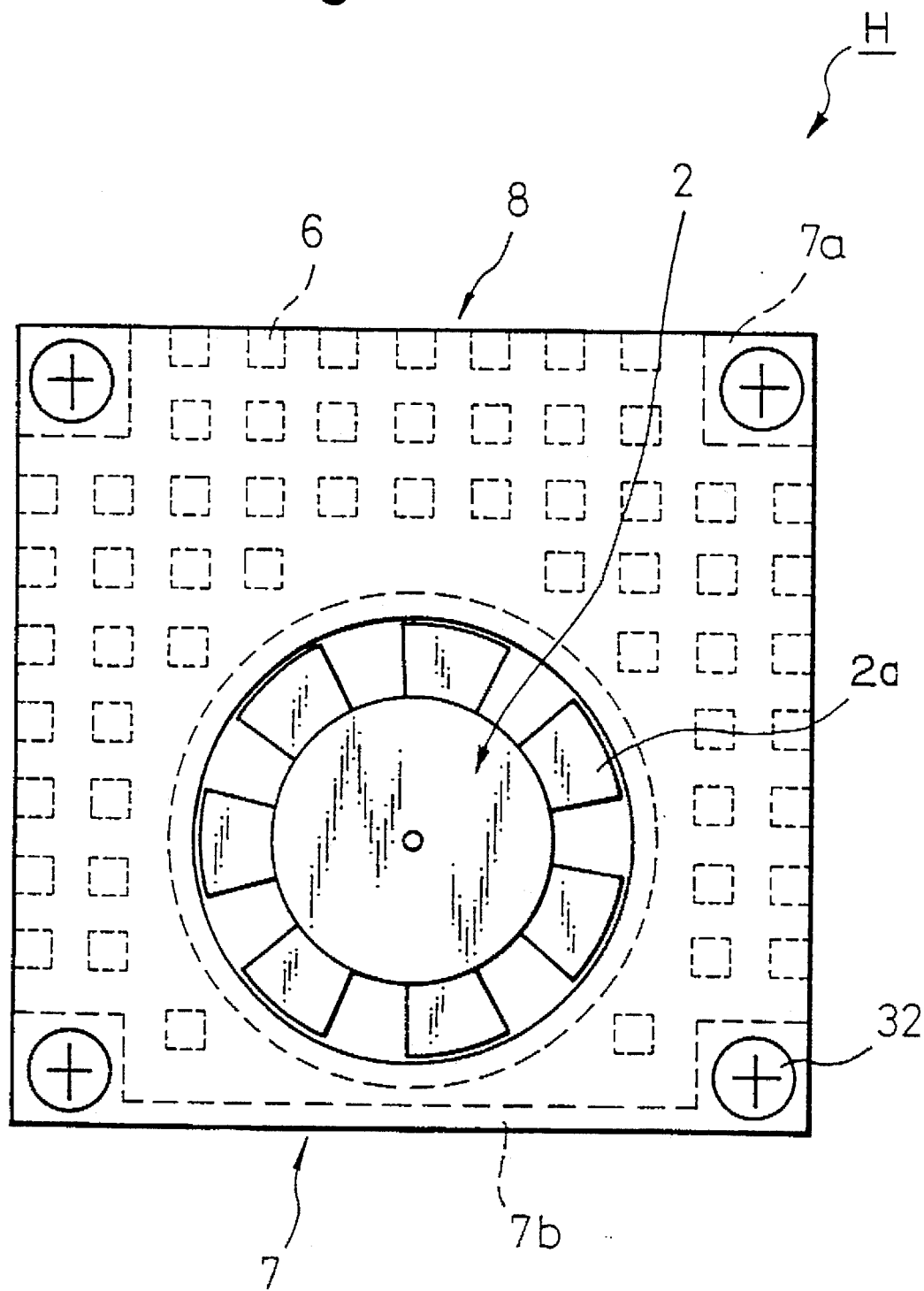
FIG. 26 is a perspective plan view of the assembled heat sink having the cover and the base in FIG. 25.

The base 7 has radiating fins 6, upright bars 7a at the four corners, and a windbreak wall 7b. The windbreak wall 7b is disposed at the side to which the fan assembly 2 is offset, shielding the side between the upright bars 7a. FIG. 26 is a perspective plan view of the assembled heat sink H with the screw 32 having the cover 8 and the base 7 in FIG. 25.

The reason why the fan assembly 2 is offset from the center of the heat sink H is to increase the cooling efficiency of the heat sink H by decreasing the distance from the heat producing part and the heat radiating part. When the fan assembly 2 is disposed at the center of the heat sink H, the center of the heat producing element 3 cannot be exposed by the cooling air generated by the rotation of the fan blade 2a. Contrary to this, when the fan assembly 2 is disposed offset from the center of the heat sink H, the center of the heat producing element 3 can be directly exposed by the cooling air generated by the rotation of the fan blade 2a.

Further, an internal temperature rise of a bearing in the fan motor 2b of the fan assembly 2 is suppressed when the fan assembly 2 is disposed offset from the center of the heat producing part. As a result, a deterioration of the grease in the bearing is suppressed to increase the life and reliability of the fan assembly 2.

The existence of the windbreak wall 7b increases the cooling effect of the cooling air 10 flowing to the center of the heat sink H.

Figure 27:
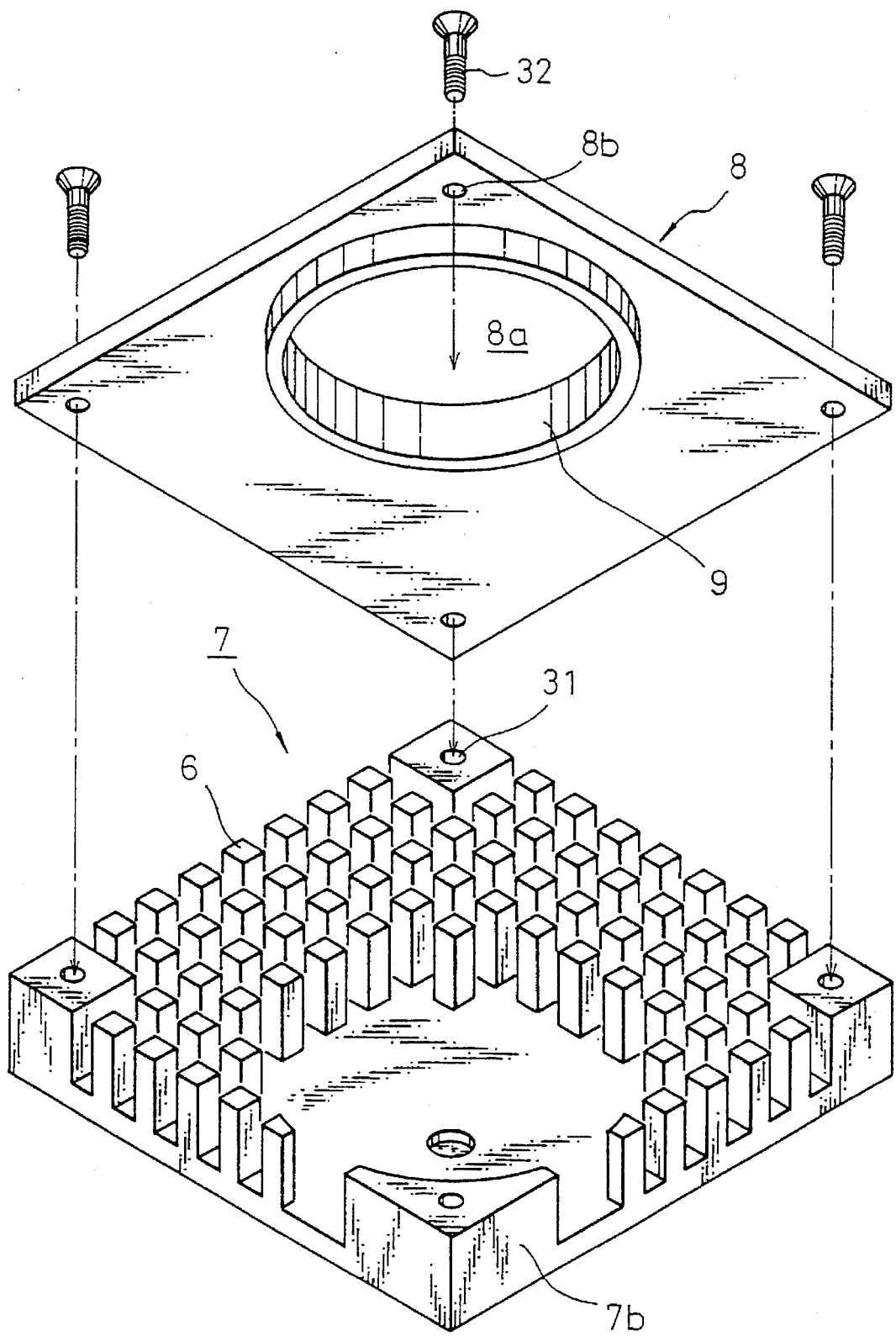
FIG. 27 is a perspective assembly diagram showing a structure of a cover and a base of the heat sink, and a manner of assembling according to a seventh embodiment of the present invention wherein a fan assembly is disposed offset to one of the corner of the heat sink.

FIG. 27 is a perspective assembly diagram showing a structure of a cover 8 and a base 7 of the heat sink H, and a manner of assembling according to a seventh embodiment of the present invention. The fan assembly 2 is disposed offset to one of the side of the heat sink H from the center thereof in the sixth embodiment as explained in FIGS. 25 and 26. Contrary to this, the fan assembly 2 is disposed offset to one of the corner of the heat sink H from the center thereof in the seventh embodiment as shown in FIG. 27.

Figure 28:
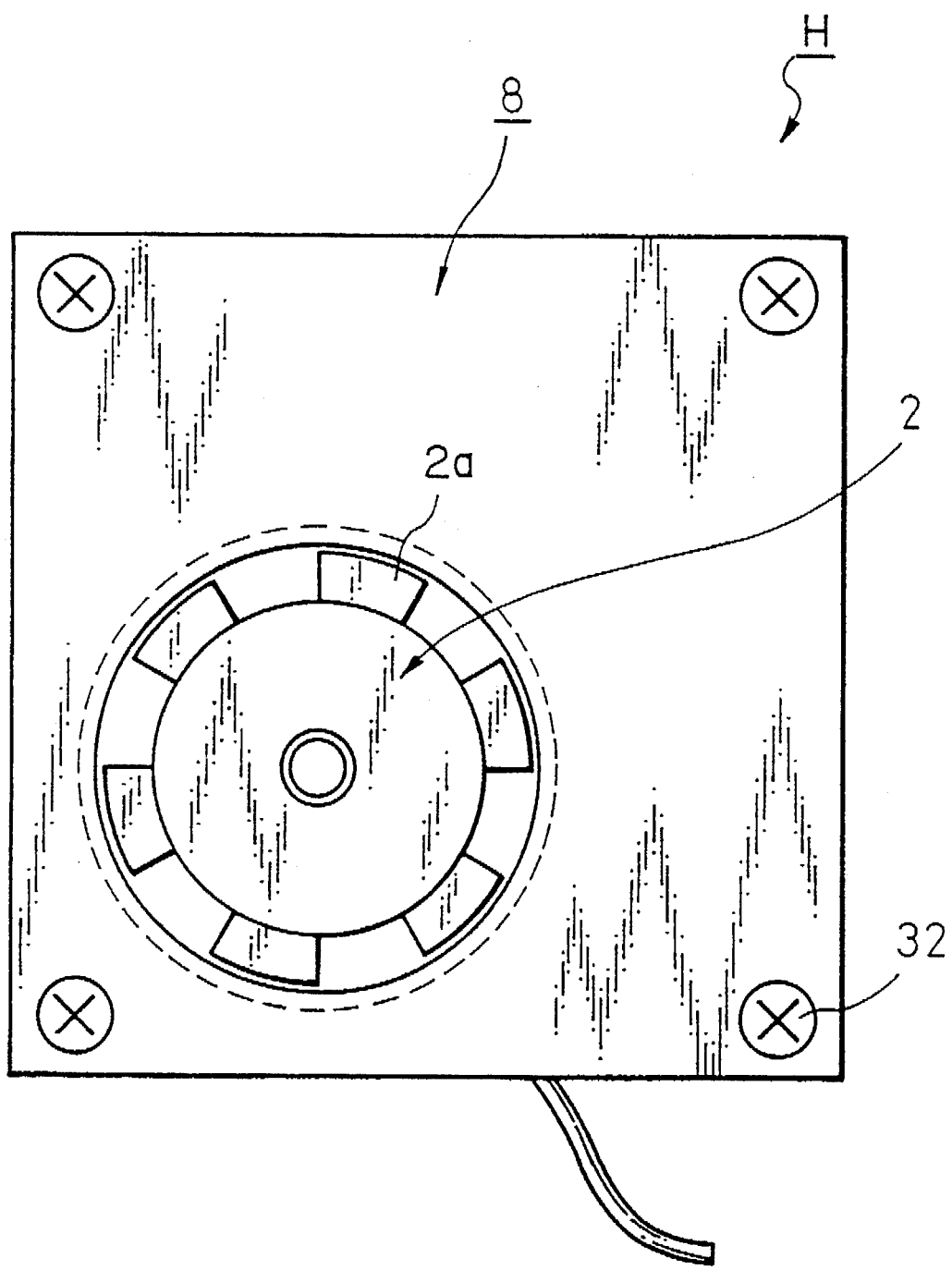
FIG. 28 is a plan view of the assembled heat sink having the cover and the base in FIG. 27.
Figure 29:
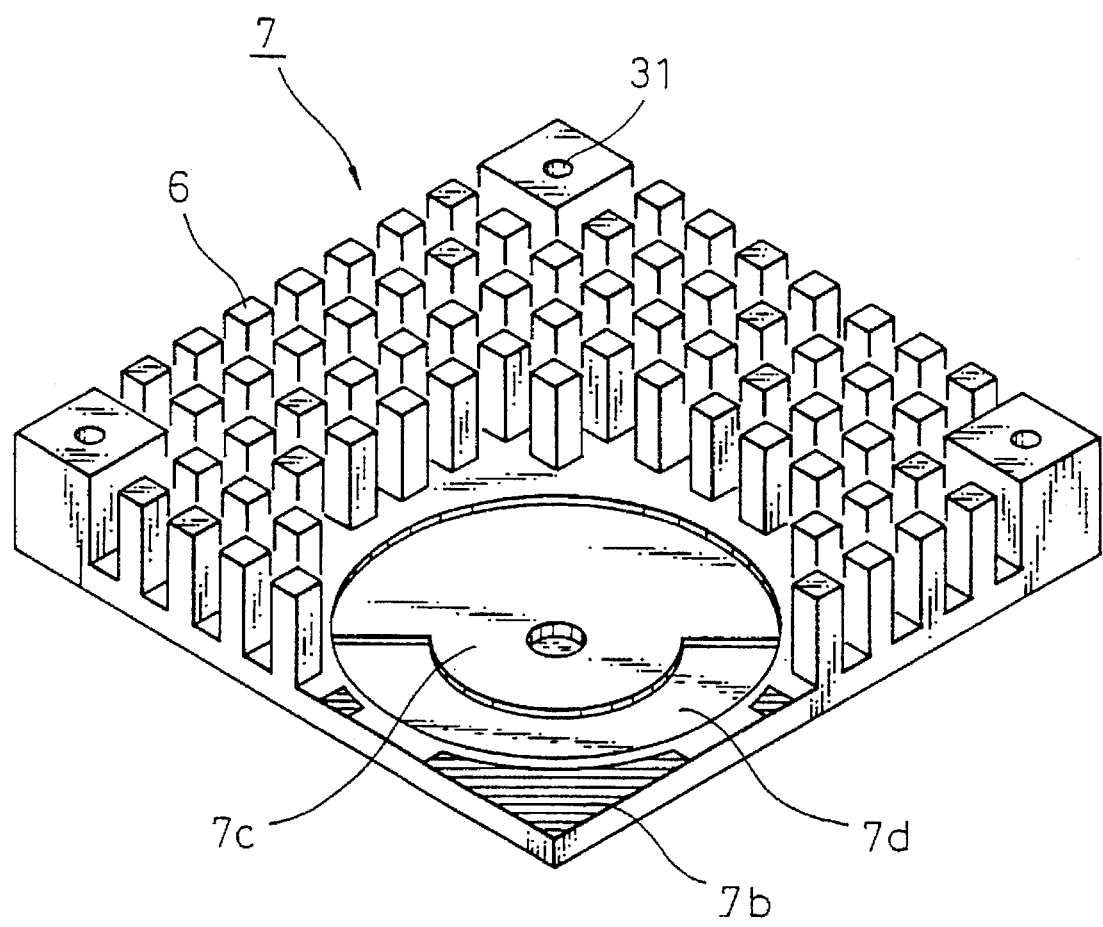
FIG. 29 is a partially cutaway view in perspective of a modified embodiment of the base in FIG. 27, wherein a space is provided by excavating an upper bottom face of the base under the position of the fan assemly.

The base 7 has radiating fins 6, upright bars 7a at the four corners, and a windbreak wall 7b. One of the bar 7a to which the fan assembly 2 is offset has a circular arc concave face and both sides thereof are extended to form a windbreak wall 7b. The windbreak wall 7b in this embodiment also makes the flow of the cooling air 10 efficient. FIG. 28 is a plan view of the assembled heat sink H with screws 32 having the cover 8 and the base 7 in FIG. 27;

FIG. 29 is a partially cutaway view in perspective of a modified embodiment of the base 7 in FIG. 27. In this embodiment, a space is formed by excavating an upper bottom face of the base 7 under the position of the fan assembly 2 where no radiating fins 6 are disposed. The space has a first stage part 7c which is a shallow recess and a second stage part 7d which is a deeper recess. The first stage 7c is formed under the fan motor 2b of the fan assembly 2 and under the half part of the trace path of the fan blade 2b, and the second stage 7d is formed under the other half part of the trace path of the fan blade 2b.

The first stage 7c and the second stage 7d may be formed on the base in the sixth embodiment explained in FIGS. 25 and 26. The first stage 7c and the second stage 7d decreases the air pressure loss due to the existence of the windbreak wall 7b by enlarging the space for the cooling air 10 to flow.

Figure 30A:
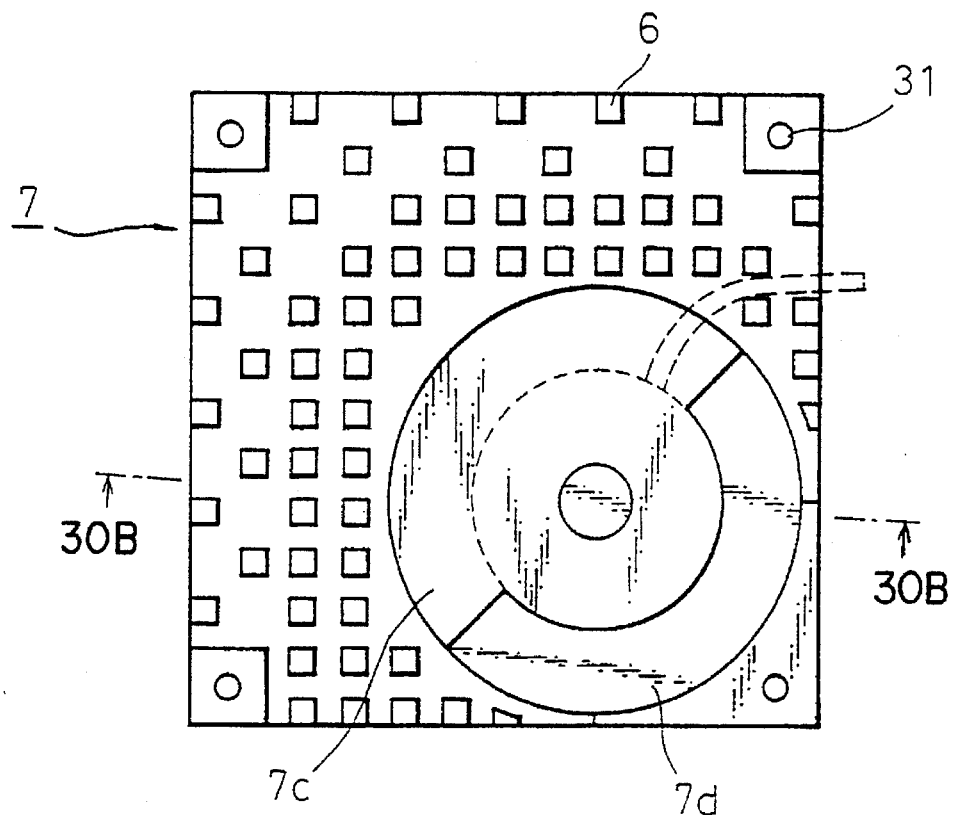
FIG. 30A is a plan view showing a modification of the base in FIG. 27 wherein a distribution of the radiation pins are changed.

FIG. 30A is a plan view showing a modification of the base 7 in FIG. 27 wherein a distribution of the radiating fins 6 are changed. The radiating fins 6 are arranged densely around the center of the base 7 and are arranged less densely around the side of the base 7. When the base 7 has such an arrangement of the radiating fins 6, cooling efficiency is increased at the center part of the heat sink H by the number of radiating fins 6, and air pressure loss is decreased at the side of the heat sink H by the space between the fins 6. As a result, the cooling efficiency of the heat sink H will be increased without decreasing the amount of air flow generated by the fan assembly 2 installed in the heat sink H.

Figure 30B:
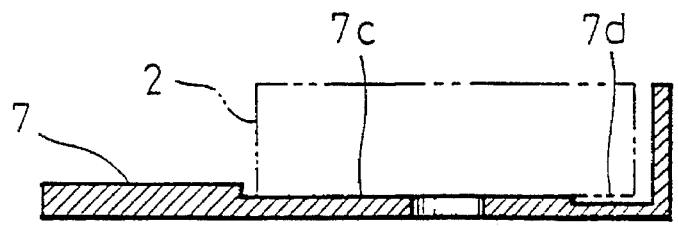
FIG. 30B is a sectional view taken on line Y—Y in FIG. 30A.

FIG. 30B is a sectional view taken on line Y—Y in FIG. 30A explaining the structure of the stages 7c and 7c.

Figure 31A:
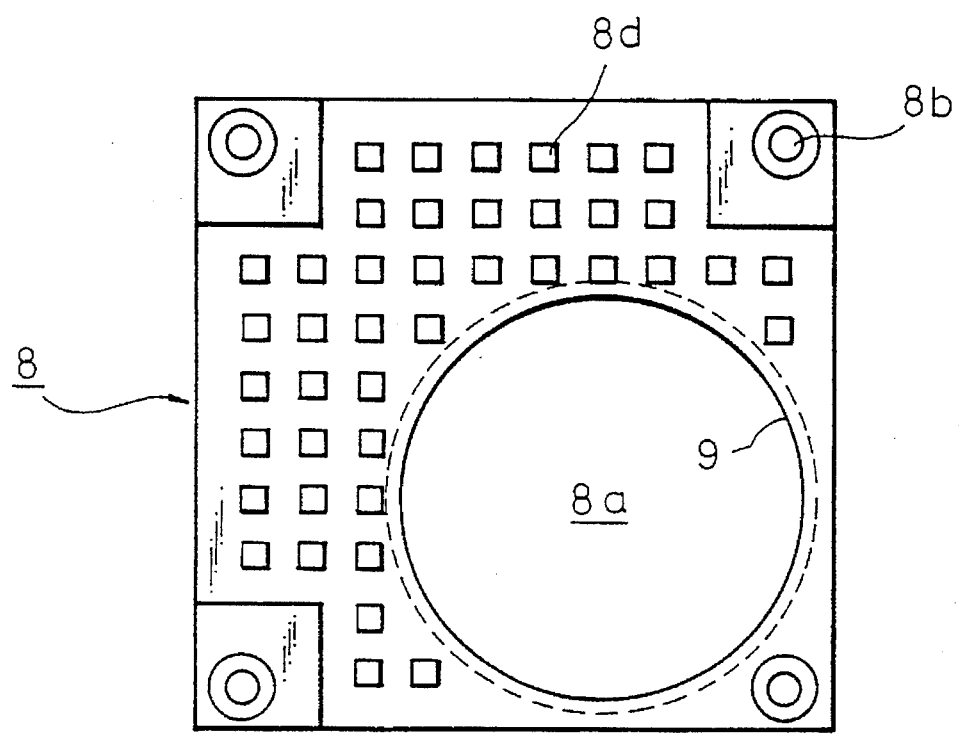
FIG. 31A is a plan view showing a modified embodiment of the cover according to the seventh embodiment of the heat sink in FIG. 27.
Figure 31B:
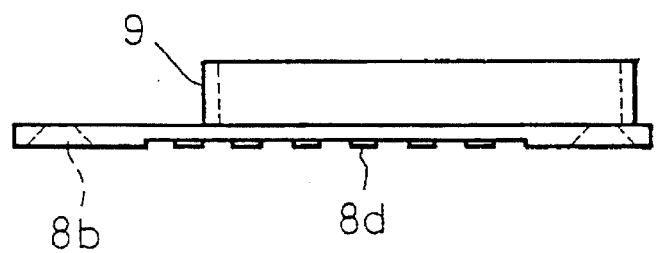
FIG. 31B is a side view of the cover in FIG. 31A.

FIGS. 31A and 31B are a plan view and a side view showing a modified embodiment of the cover 8 according to the seventh embodiment of the heat sink H in FIG. 27. The cover 8 in this embodiment has a plurality of radiating pins 8d on the top face thereof as explained in FIGS. 20A and 20B embodiment. The radiating pins 8d in this embodiment are formed by decreasing the thickness of the cover 8 making the total thickness of the cover 8 equal to that of the cover 8 in FIG. 8. The cover 8 is cooled effectively with the radiating pins 8d on the top face thereof.

Note, the structure of making grooves 8c on the top face of the cover 8 as explained in FIGS. 17A to 19B, and the structure making radiating pins 8e on the bottom face of the cover 8 can be effectively applied to the sixth and the seventh embodiment in which the fan assembly 2 is disposed offset from the center of the heat sink H as explained above. Further, the arrangement of the radiating fins 6 as explained in FIG. 30A is not limited by the embodiment, and the arrangement of the radiating fins 6 are changeable in accordance with the capacity of the fan assembly 2 and the shape of the fan blade 2a to increase the cooling efficiency.

Figure 32A:
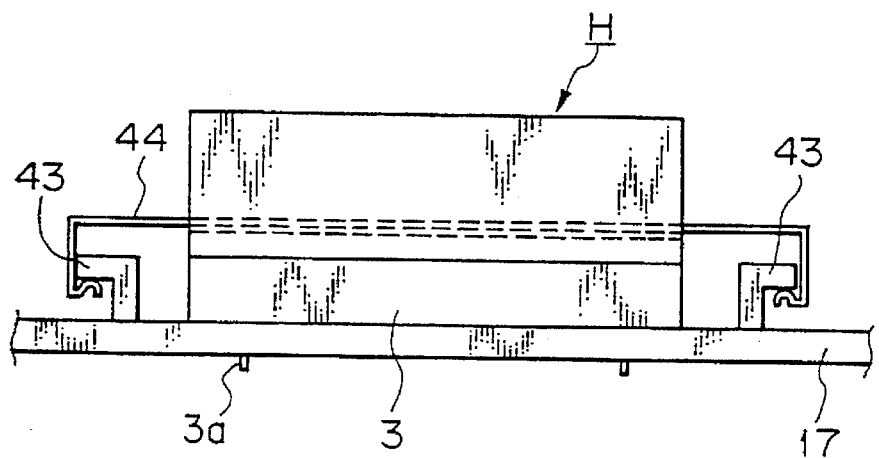
FIG. 32A is an explanatory view showing one example of a manner of mounting the heat sink on the heat producing element.
Figure 32B:
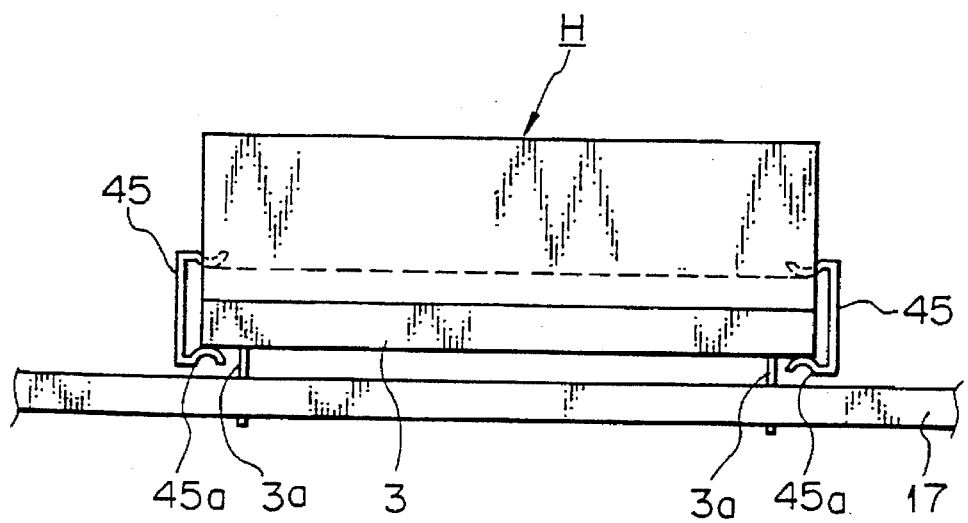
FIG. 32B is an explanatory view showing another example of a manner of mounting the heat sink on the heat producing element.

FIGS. 32A and 32B show an example of a way of fitting the heat sink H to the heat producing element 3 disposed on the printed board 17. In the embodiment as shown in FIG. 32A, shoes 43 for mounting the heat sink H on the heat producing element 3 are soldered to the printed board 17. Each shoe 43 has an L-shaped cross section. A fixing spring bar 44 is attached to the shoes 43, to push the heat sink H against the heat producing element 3.

FIG. 32B shows another example of a manner of fitting the heat sink H to the heat producing element 3. A fixing clip 45 is formed as a channel-shape and has ends 45a. The heat sink H is mounted on the heat producing element 3 by the pressing force of the fixing clip 45. A plurality of the clips 45 are used to fix the heat sink H to the heat producing element 3. Numeral 3a denotes an I/O pin of the heat producing element 3.

Figure 33A:
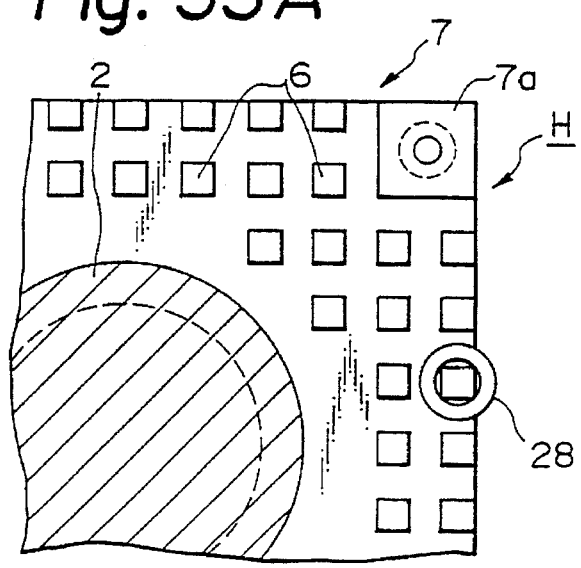
FIG. 33A is a partial plan view showing a base mounted on the heat producing element by using a heat sink fixture.
Figure 33B:
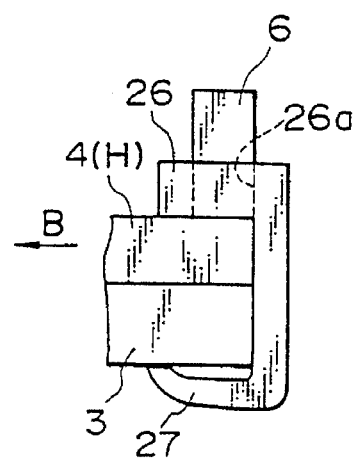
FIG. 33B is a partial side view of the base of the heat sink and the heat producing element in FIG. 33A fixed by the fixture.
Figure 33C:
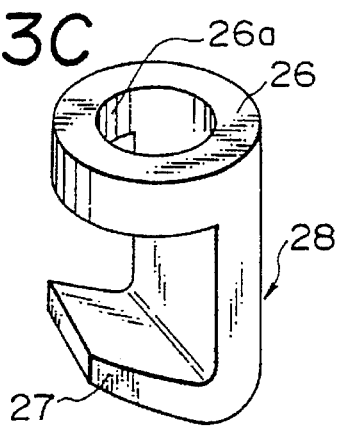
FIG. 33C is a perspective view showing a structure of the heat sink fixture in FIGS. 33A and 33B.

Further, FIGS. 33A to 33F show another example of fitting the heat sink H to the heat producing element 3 by using a heat sink fixture 28. The heat sink fixture 28 has a level segment 26 having a fin hole 26a and a L-shaped pressing segment 27 extended from the level segment 26 as shown in FIG. 33C. The size of the fin hole 26a is as large as the pin-like radiating fin 6 projected on the fixing wall 4 of the base 7 for penetrating therein as shown in FIG. 33B.

The fin hole 26a of the heat sink fixture 28 is first penetrated by the radiating fin 6 with the pressing segment 27 bent. The heat sink fixture 28 is then moved and pressed until the pressing segment 27 clips the bottom face of the heat producing element 3. After the fitting of the heat sink fixture 28, the heat sink H is mounted on the heat producing element with pressure by the heat sink fixture 28.

Figure 33D:
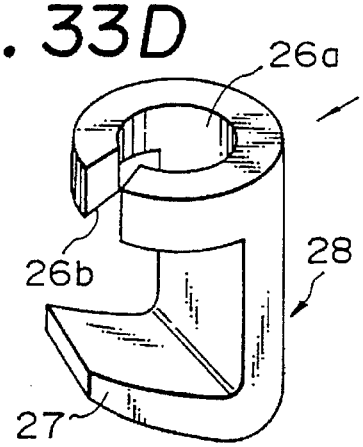
FIGS. 33D to 33F are perspective views showing other embodiments of the heat sink fixture.

Note that, the fin hole 26a provided on the level segment 26 of the heat sink fixture 28 may be be cut by a notch part 26b having a narrower distance than a diameter of the hole 26a as shown in FIG. 33D. When the fin hole 26a has the notch part 26b, it is easy to mount the heat sink H on the heat producing element 3 by using the heat sink fixture 28, since the distance of the notch part 26b is enlarged by pressing the heat sink fixture 28 to the direction of the radiating fin 6 as shown by an arrow in FIG. 33D.

Figure 33E:
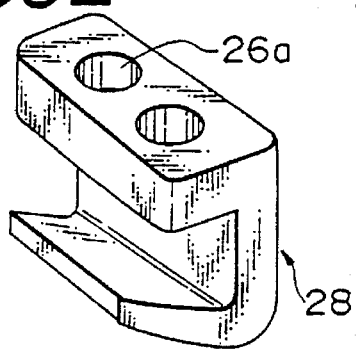
Figure 33F:
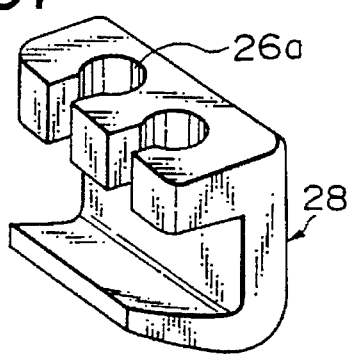

Further, the the heat sink fixture 28 may have a parallel shape having a plurality of holes 26a or holes 26a with notch parts 26b as shown in FIGS. 33E and 33F.

In FIG. 10, the lead 34 is used to supply electricity to the fan motor 2b of the fan assembly 2.

Figure 34:
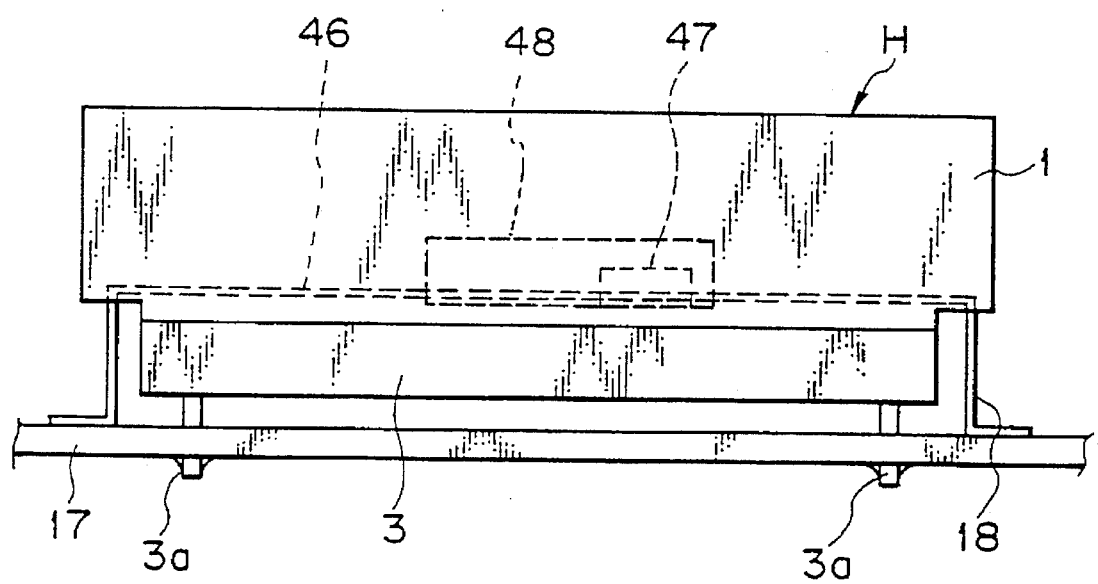
FIG. 34 is an explanatory side view showing a structure for supplying electricity to the fan assembly according to one embodiment of the present invention.
Figure 35:
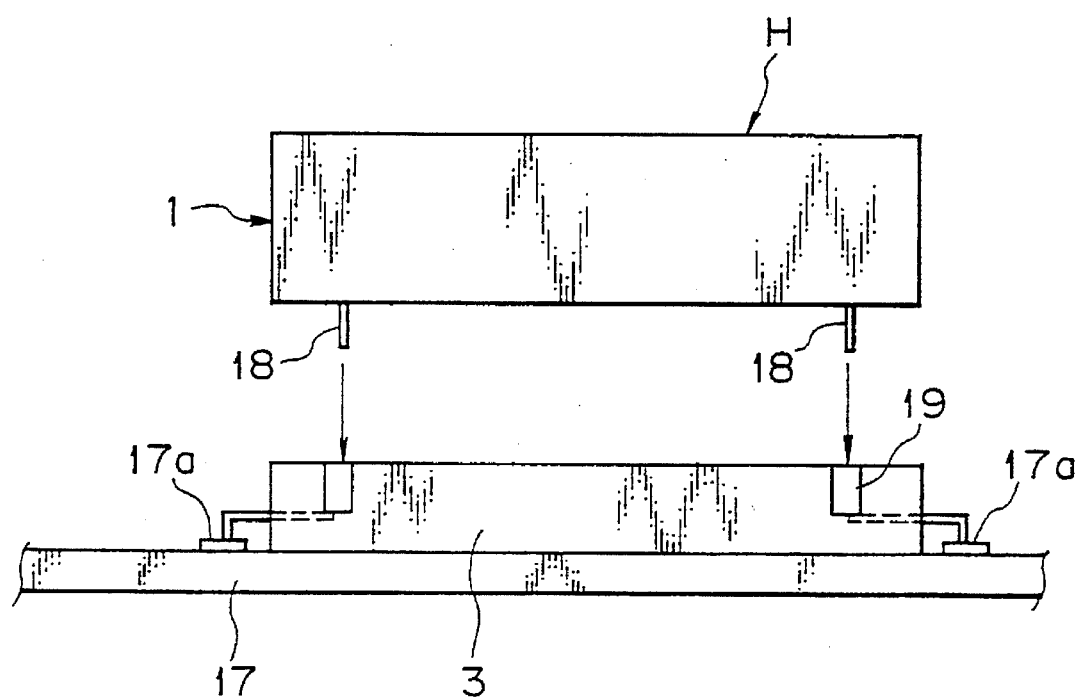
FIG. 35 is an explanatory side view showing a structure for supplying electricity to the fan assembly according to another embodiment of the present invention.

In FIG. 34, a power supply terminal 18 protrudes from the bottom side of the heat sink body 1. The terminal 18 is soldered to the printed board 17, to supply electricity to the fan motor 2b of the fan assembly 2. The terminal 18 may be attached to the printed board 17 according to a surface mounting technique or a through hole technique. Numeral 46 in FIG. 34 denotes internal circuit in the heat sink body 1, 47 denotes a fan drive circuit, and 48 denotes a controller.

FIG. 32 shows still another example of a manner of fitting the heat sink H to the heat producing element 3. In this embodiment, power supply units 19 such as pads and contacts are disposed on the heat producing element 3 and connected to power source pads 17a of the printed board 17. The heat sink H has power supply terminals 18, which are connected to the power supply units 19, to supply electricity to the fan assembly 2.

Figure 36:
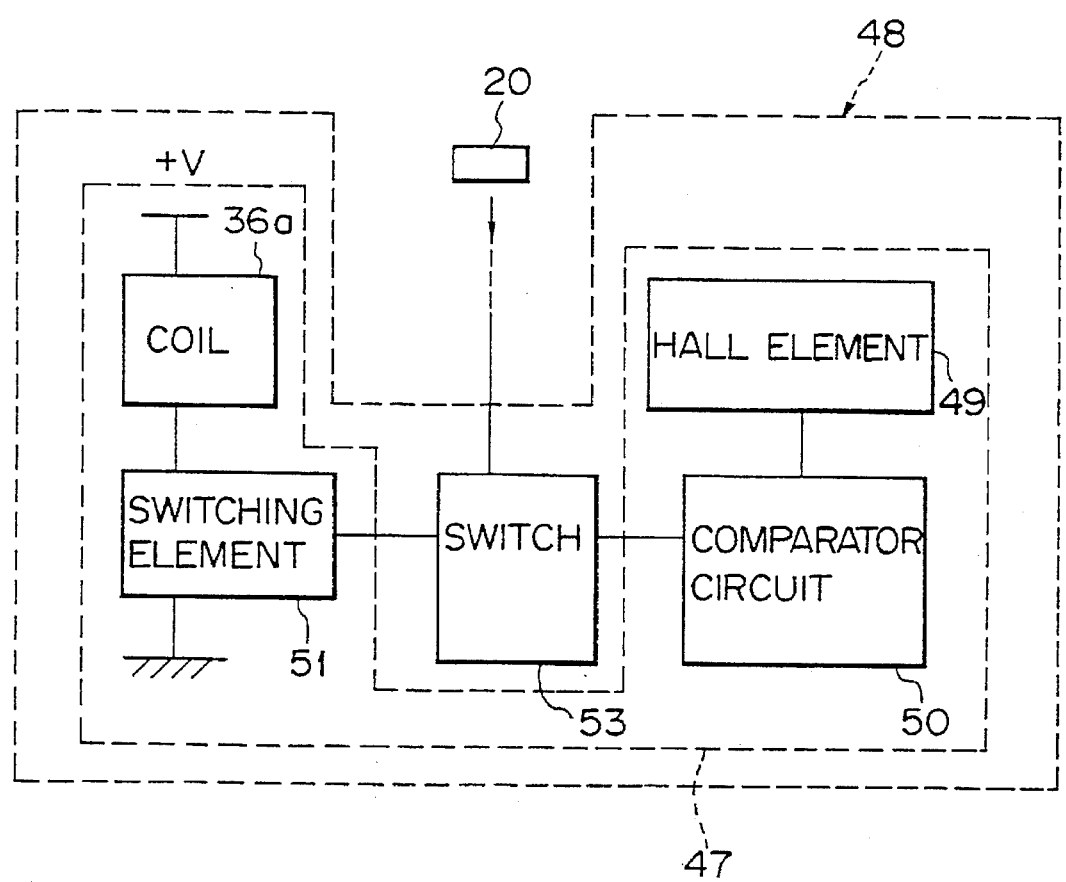
FIG. 36 is a block diagram showing a fan assembly controller according to one embodiment of the present invention.
Figure 37:
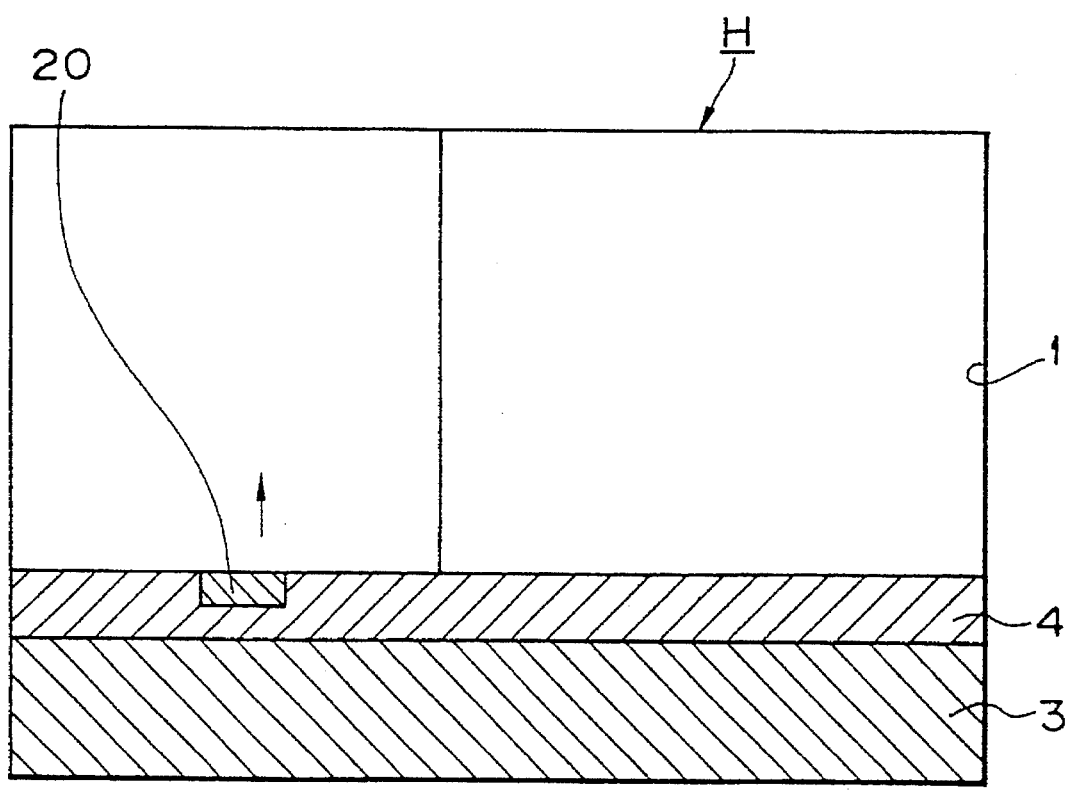
FIG. 37 is a sectional view showing a temperature detecting structure of the heat sink according to one embodiment of the present invention.

FIG. 36 shows a controller 48 for controlling the ON/OFF operation or rotational speed of the fan assembly 2. The controller 48 comprises a fan driving circuit 47 and a switch 36. The fan driving circuit 47 comprises a Hall element 49, a comparator circuit 50, a switching element 51 such as a switching transistor, and a coil 36a. In FIG. 37, a temperature sensor 20 such as a thermocouple or thermistor is embedded in the fixing wall 4 of the heat sink body 1. The temperature sensor 20 provides the switch 53 with an ON/OFF signal.

The switch 53 may comprise a transistor, a reed switch, or a relay.

Figure 38:
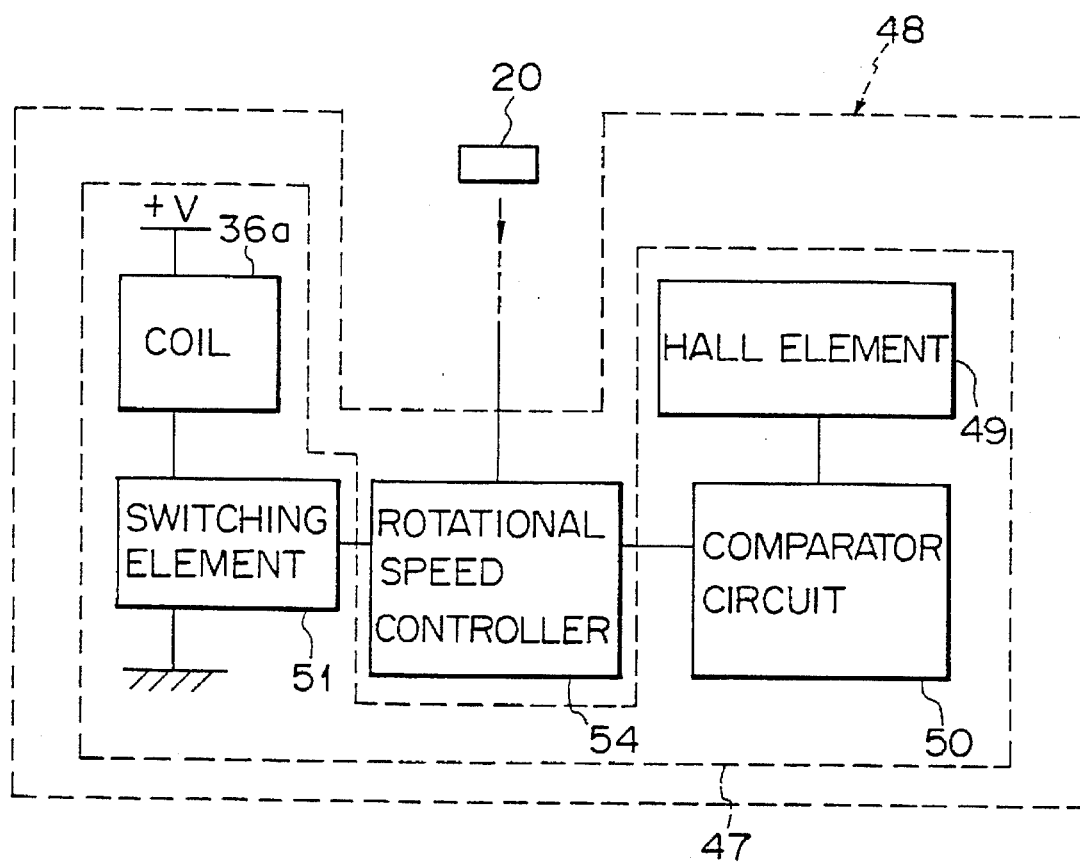
FIG. 38 is a block diagram showing a fan assembly controller according to another embodiment of the present invention.

FIG. 38 shows a rotational speed controller for the fan assembly 2. The rotational speed controller 54 is disposed between the switching element 51 and the comparator circuit 50 of the fan driving circuit 47. The rotational speed controller 54 has an oscillator whose number of oscillations corresponds to an output of the temperature sensor 20, thereby controlling the rotational speed of the fan assembly 2.

Figure 39:
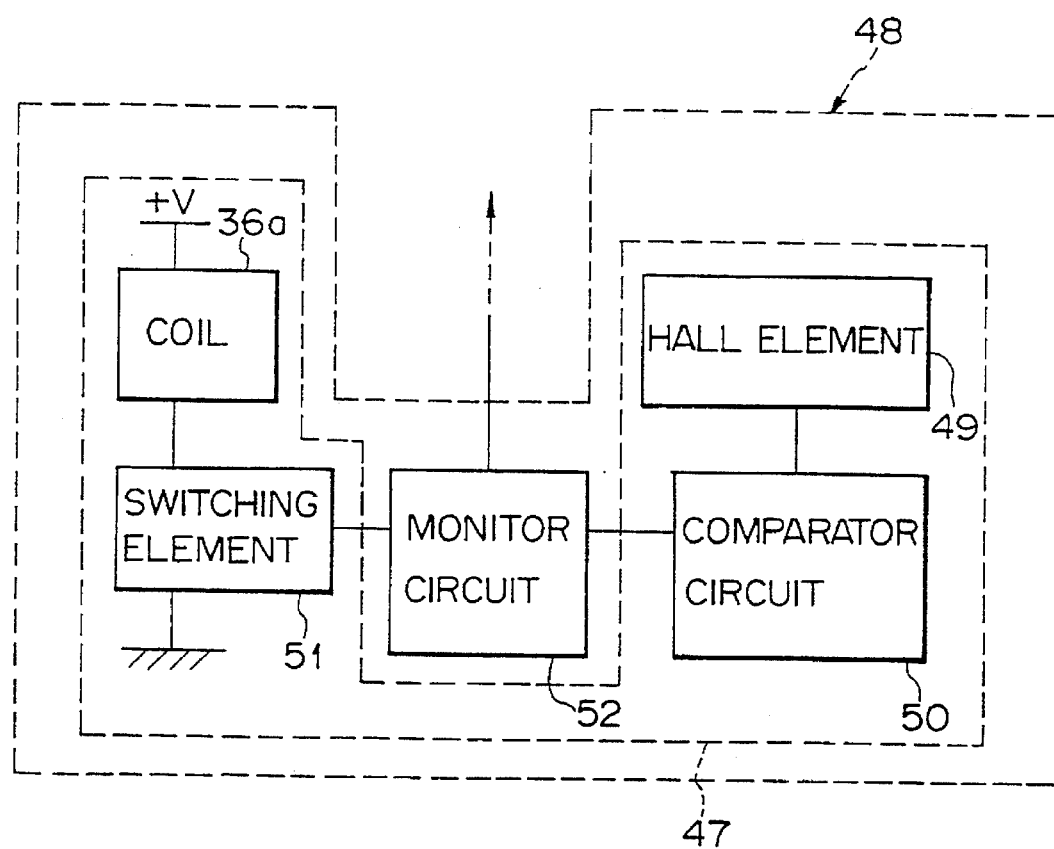
FIG. 39 is a block diagram showing a fan assembly controller according to other embodiment of the present invention.

FIG. 39 shows a controller 48 for monitoring a rotational speed. The controller 48 includes a rotational speed monitor circuit 52 having a pulse generator. The pulse generator generates pulses in response to the rotational speed of the fan assembly 2.

Note that the controller 48 may be disposed in the fan assembly 2, or on a separate board.

Figure 40A:
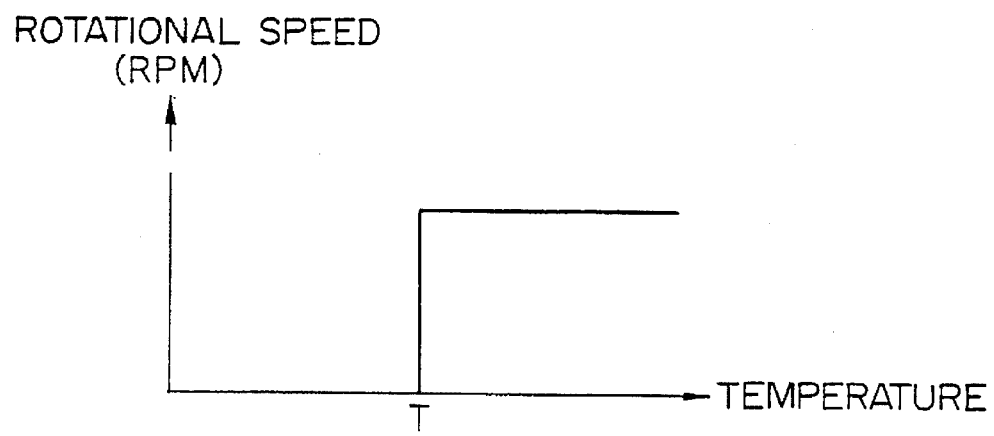
FIGS. 40A and 40B are charts showing a different rotational speed control characteristic of the fan assembly.
Figure 40B:
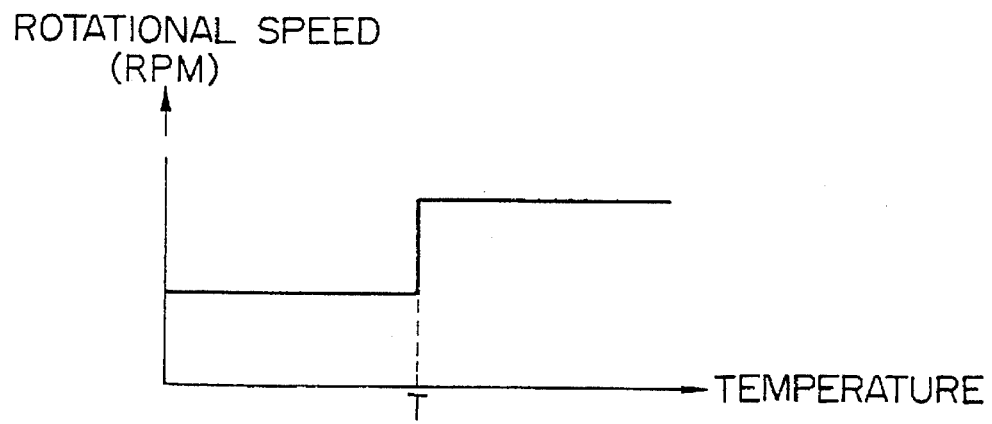

Further, above-described rotational speed control of the fan assembly 2 can be realized in various ways. The control in FIG. 40A shows that the fan assembly 2 began to rotate when the temperature became a predetermined value T. The control in FIG. 40B shows that the fan assembly 2 rotates slowly when the temperature is lower than the value T and the fan assembly 2 rotates faster when the temperature is equal or larger than the value T.

Figure 41:
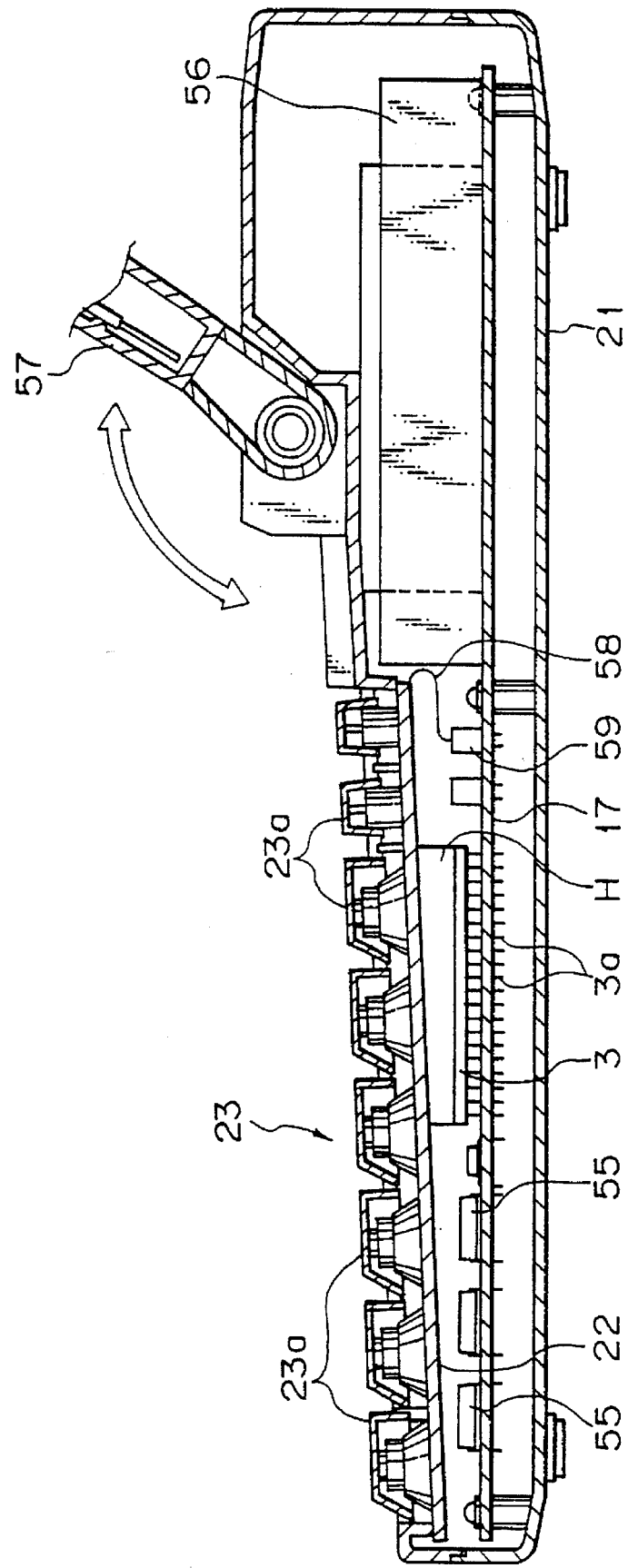
FIG. 41 is an application of the heat sink according to the present invention disposed in a portable electronic apparatus.
Figure 42:
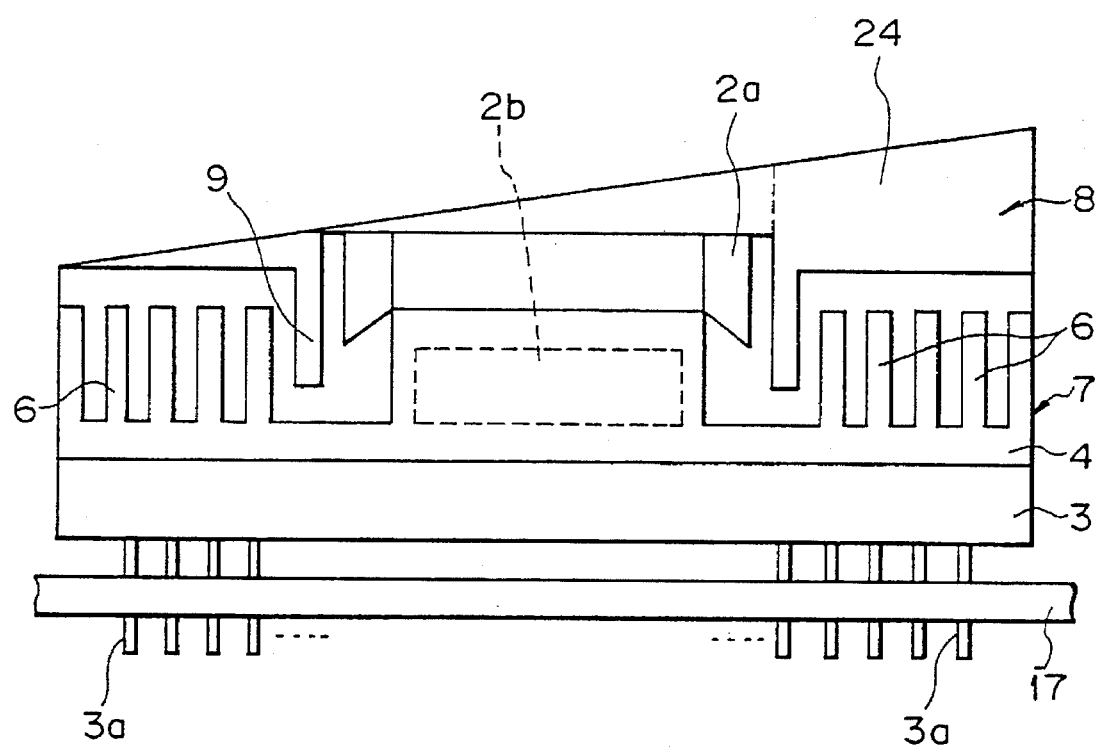
FIG. 42 is an explanatory side view showing a mounted condition of the heat sink on the heat producing element in FIG. 41.
Figure 43:
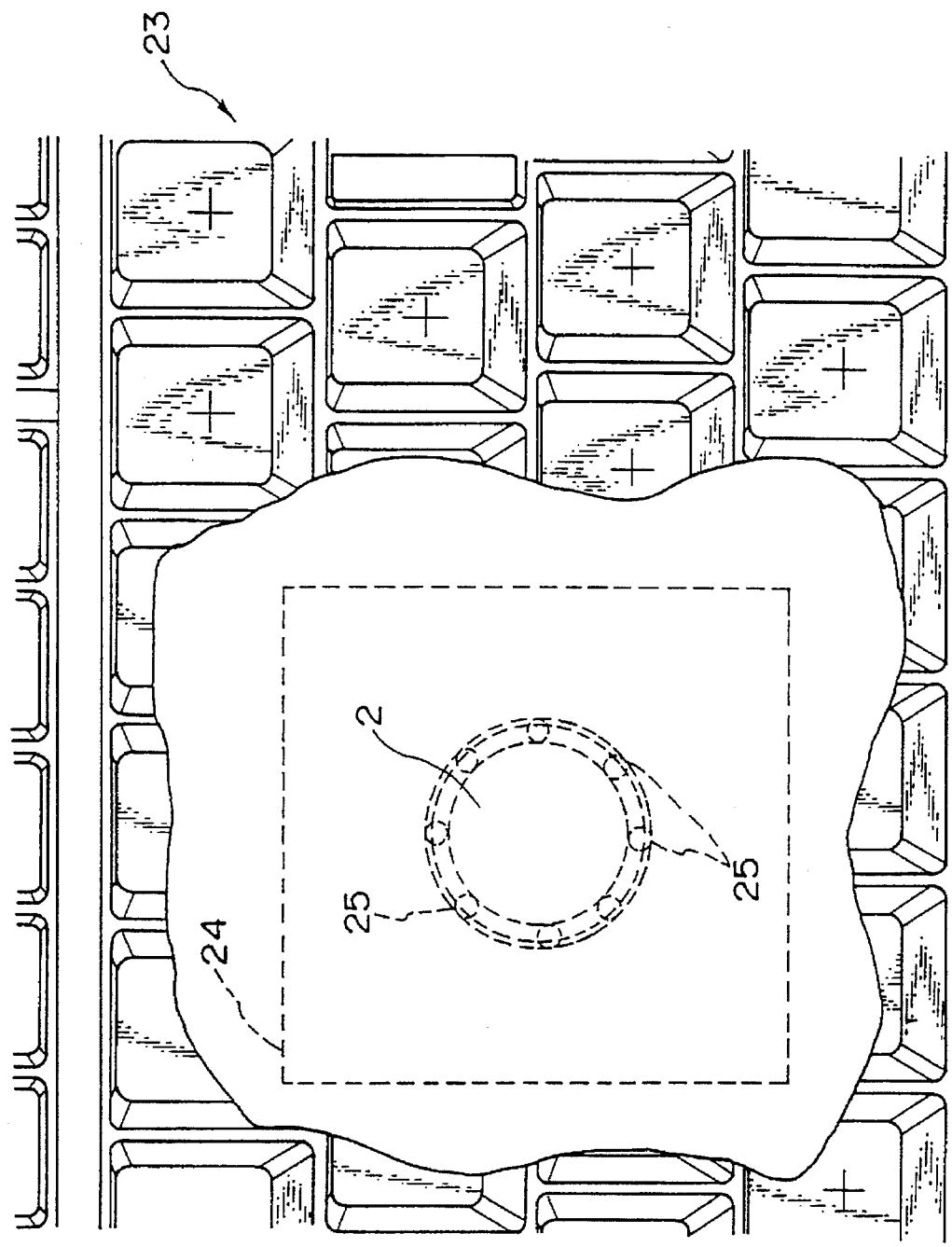
FIG. 43 is a partially cutaway plan view showing a structure of a keyboard assembly in FIG. 41.

FIGS. 41 to 43 show an application of the present invention where the heat sink H is used in a portable electronic apparatus such as a notebook-type personal computer. The portable electronic apparatus has a printed board 17 and a drive unit 56 such as a floppy disk drive or a hard disk drive in its casing 21.

A heat producing element 3 such as an MPU (Micro Processing Unit) and other electronic parts 55 are mounted on the printed board 17. The liquid crystal display unit 57 is also disposed on the casing and is able to swing as shown by an arrow in FIG. 41

A keyboard assembly 23 is disposed above the printed board 17 and is connected to the printed board 17 by a flat cable 58. Reference 59 denotes a connecter for connecting the flat cable 58.

The keyboard assembly 23 is, as is well-known to public, composed of a plurality of key tops 23a arranged in matrix above the housing thereof which is made of a synthetic resin. A reinforcing plate 22 made of aluminum is disposed under the housing covering the full bottom face thereof for increasing the stiffness of the whole body.

The heat sink H for cooling the heat producing element 3 mounted on the printed board 17 is formed by fixing the cover 8 on the base installing the fan assembly 2 as shown in FIG. 42. A surrounding wall 24 is disposed on the whole edge of the cover 8, and an upper edge of the surrounding wall 24 is contacted to the bottom face of the reinforcing plate 22.

FIG. 43 shows a plurality of cooling air ventilation holes 25 disposed on the reinforcing plate 22 corresponding to the position of the fan assembly 2.

The cooling air 10 is forcibly drawn into the casing 21 through the cooling air ventilation holes 25.

As explained above, the heat sink H of the present invention has a good cooling efficiency of the heat producing element, so that the heat sink H of the present invention can be effectively used for the portable electronic apparatus having a limitation of the internal space.

What is claimed is:

1. A heat sink for cooling a heat producing element, comprising:
 a heat sink body including a base which is capable of being mounted on the heat producing element;
 a fan assembly installed in an internal space of the heat sink body, wherein the fan assembly includes a drive and fan blades fixed on a rotating shaft of the drive, wherein a width of the heat sink body and the diameter of the fan assembly are substantially different, and wherein a region between the fan assembly and the outer periphery of the heat sink body is defined;

heat radiation fins disposed on a top face of the base within the region; and a cover closing an upper portion of the region of the base.

2. The heat sink as set forth in claim 1, wherein the cover includes an aperture for receiving the fan assembly, a vertical partition extending downward from a periphery of the aperture surrounding the fan assembly.

3. The heat sink as set forth in claim 1, further comprising radiation pins disposed on a bottom face or an upper face of the cover.

4. The heat sink as set forth in claim 3, wherein the radiation pins are disposed on the bottom face of the cover so as to be positioned in the space surrounded by the radiation fins.

5. The heat sink as set forth in claim 1, further comprising cooling grooves disposed on the upper face of the cover.

* * * * *